US012681051B2

(12) United States Patent
Masui et al.

(10) Patent No.: US 12,681,051 B2
(45) Date of Patent: Jul. 14, 2026

(54) OPTICAL STEP-UP TRANSFORMER

(71) Applicant: Lumileds Singapore Pte. Ltd.,
Singapore (SG)

(72) Inventors: Hisashi Masui, Newark, CA (US);
Ronald Johannes Bonne, Plainfield, IL
(US); Oleg Borisovich Shchekin, San
Francisco, CA (US)

(73) Assignee: Lumileds Singapore Pte. Ltd.,
Singapore (SG)

( * ) Notice: Subject to any disclaimer, the term of this
patent is extended or adjusted under 35
U.S.C. 154(b) by 110 days.

(21) Appl. No.: 18/574,670

(22) PCT Filed: Jun. 28, 2022

(86) PCT No.: PCT/US2022/035327
§ 371 (c)(1),
(2) Date: Dec. 27, 2023

(87) PCT Pub. No.: WO2023/278455
PCT Pub. Date: Jan. 5, 2023

(65) Prior Publication Data
US 2024/0385225 A1     Nov. 21, 2024

Related U.S. Application Data

(60) Provisional application No. 63/215,590, filed on Jun.
28, 2021.

(51) Int. Cl.
G01R 15/22     (2006.01)
H02P 13/00     (2006.01)

(52) U.S. Cl.
CPC .............. G01R 15/22 (2013.01); H02P 13/00
(2013.01)

(58) Field of Classification Search
CPC ............................... G01R 15/22; H02P 13/00
See application file for complete search history.

(56) References Cited

U.S. PATENT DOCUMENTS

| | | | |
|---|---|---|---|
| 4,992,922 | A | 2/1991 | Ishimura et al. |
| 5,978,239 | A | 11/1999 | Koitsalu |
| | | (Continued) | |

FOREIGN PATENT DOCUMENTS

| | | |
|---|---|---|
| CN | 205812454 | 12/2016 |
| WO | WO-2023278455 A1 | 1/2023 |

OTHER PUBLICATIONS

"International Application Serial No. PCT US2022 035327, International Preliminary Report on Patentability mailed Jan. 11, 2024",
11 pages.

(Continued)

*Primary Examiner* — Lee E Rodak
*Assistant Examiner* — Zannatul Ferdous
(74) *Attorney, Agent, or Firm* — Schwegman, Lundberg
& Woessner, P.A.

(57)     ABSTRACT

A structure and method of operating an optical step-up
transformer are described. The optical step-up transformer
has at least one photodiode and at least one photoreceiver.
The photoreceiver receives light emitted from the photo-
diode and generates a voltage proportional to the number of
series-connected photoreceivers. The photodiode and pho-
toreceiver may be electrically isolated or may share a
common anode or cathode. The voltage applied to the
photodiode may be a DC or PWM signal.

20 Claims, 17 Drawing Sheets

(56) References Cited

U.S. PATENT DOCUMENTS

| | | | | |
|---|---|---|---|---|
| 6,031,603 | A * | 2/2000 | Fine .................. | A61B 5/14552 |
| | | | | 356/41 |
| 2010/0201527 | A1 * | 8/2010 | Jensen ................ | G08B 13/193 |
| | | | | 340/541 |
| 2011/0210236 | A1 | 9/2011 | Hertel | |
| 2012/0098753 | A1 * | 4/2012 | Lu ........................ | G06F 3/0421 |
| | | | | 345/173 |
| 2013/0055052 | A1 * | 2/2013 | Kaeriyama .............. | H04B 5/22 |
| | | | | 714/799 |
| 2013/0175924 | A1 * | 7/2013 | Codutti ................. | H05B 45/54 |
| | | | | 315/77 |
| 2013/0278064 | A1 * | 10/2013 | Turqueti ............. | H04B 10/807 |
| | | | | 307/43 |
| 2016/0308496 | A1 | 10/2016 | Isoda | |
| 2018/0109177 | A1 * | 4/2018 | Truong .................. | H02M 1/32 |
| 2018/0182927 | A1 * | 6/2018 | Vampola ................. | G09G 3/34 |
| 2019/0154870 | A1 | 5/2019 | Lin | |
| 2020/0253010 | A1 * | 8/2020 | Pampattiwar .......... | H05B 45/44 |
| 2020/0328605 | A1 * | 10/2020 | Weber .................... | H02J 50/10 |
| 2023/0023001 | A1 * | 1/2023 | Mori ...................... | H05B 45/14 |

OTHER PUBLICATIONS

"European Application Serial No. 22834067.5, Response to Communication Pursuant to Rules 161 and 162 EPC filed Aug. 5, 2024", 13 pages.
"European Application Serial No. 22834067.5, Extended European Search Report mailed Apr. 17, 2025", 6 pages.
"International Application Serial No. PCT/US2022/035327, International Search Report mailed Oct. 4, 2022", 3 pgs.
"International Application Serial No. PCT/US2022/035327, Written Opinion mailed Oct. 4, 2022", 9 pgs.

* cited by examiner

OPTICAL STEP-UP TRANSFORMER

CLAIM OF PRIORITY

This application is a U.S. National Stage Filing under 35 U.S.C. 371 from International Application No. PCT/US2022/035327, filed Jun. 28, 2022 and published in English as WO 2023/278455 on Jan. 5, 2023, which claims the benefit of U.S. Provisional Application No. 63/215,590, filed on Jun. 28, 2021, each of which is hereby incorporated by reference in its entirety.

TECHNICAL FIELD

The present disclosure relates generally to an optical step-up transformer.

BACKGROUND

Power supplies often use a step-up transformer, in which the voltage and current in an AC circuit is multiplied. Typically, the manner in which such a transformer operates is through the use of a primary and secondary winding in which the secondary winding has an increased number of turns compared with the primary winding. In addition to windings, a number of components are used in various types of electrical transformers, depending on whether an AC or DC source is used to generate the transformed signal. DC sources may be particularly difficult to use, as transformation from DC to AC is used on the primary side and filtering of the transformed signal is used on the secondary side. Optical transformers have been developed to simplify such a transformer, as well as improving output signal characteristics, most notably signal noise.

BRIEF DESCRIPTION OF THE DRAWINGS

To provide a more complete understanding and features and advantages thereof, reference is made to the following description, taken in conjunction with the accompanying figures, wherein like reference numerals represent like parts, in which.

DETAILED DESCRIPTION

The systems, methods and devices of this disclosure may include one or more innovative aspects, where the innovative aspects may individually or in combination contribute to the desirable attributes disclosed herein. Details of one or more implementations of the subject matter described in this specification are set forth in the description below and the accompanying drawings.

As above, optical step-up transformers as described herein may be used instead of magnetic and electromagnetic transformers, which use a significant amount of space in a device as well as introducing potentially problematic magnetic fields. The optical step-up transformers may be used in place of a linear power supply such as a battery charger. The optical step-up transformers may allow for power transfer and circuit decoupling with the added benefit of providing low or zero idle power consumption. In addition, an optical step-up transformer may be physically smaller and lighter than other types of transformers.

Optical step-up transformers may contain a semiconductor emitter-detector pair. The emitter may generate photons that have energy proportional to the turn-on voltage of the emitter. The turn-on voltage is about equal to the applied voltage. Thus, the photon energy (eV) is approximately equal to applied bias (V). Light emitting diodes (LEDs) may be formed from a number of different semiconductors, dependent on the color of light desired from the LED. Typically, LEDs are formed from ternary or quaternary combinations of direct bandgap III-V materials (Al, In, Ga, As, N, P), in particular InGaN (blue, green, and ultraviolet high-brightness LEDs), AlGaInP (yellow, orange, and red high-brightness LEDs), AlGaAs (red and infrared LEDs), and GaP (yellow and green LEDs). The tailoring permitted by such semiconductor compounds may permit the bandgap of the LED to be tailored, and thus the light emitted (emitted photon energy) to be tailored. For example, while InGaN has a bandgap that extends from about 0.69 eV (infrared) to 3.4 eV (ultraviolet), for an InGaN LED, the bandgap may be approximately 2.5 eV, and thus the corresponding turn-on voltage of the LED is in about 2.5 V.

The light from the LED may be detected by a detector, such as a photodiode, which is configured to absorb the photon from the emitter and generate a current based on the absorption. In some cases, the energy that is detected by the detector may be tunable. When the detector receives the photons from the LED, a voltage near the turn-on voltage appears between the detector terminals, which, as above, may be about 2.5 V for an InGaN LED emitter. In this emitter-detector configuration, the secondary voltage at the detector is determined by the photon energy and turn-on voltage of the detector.

Figure 1:
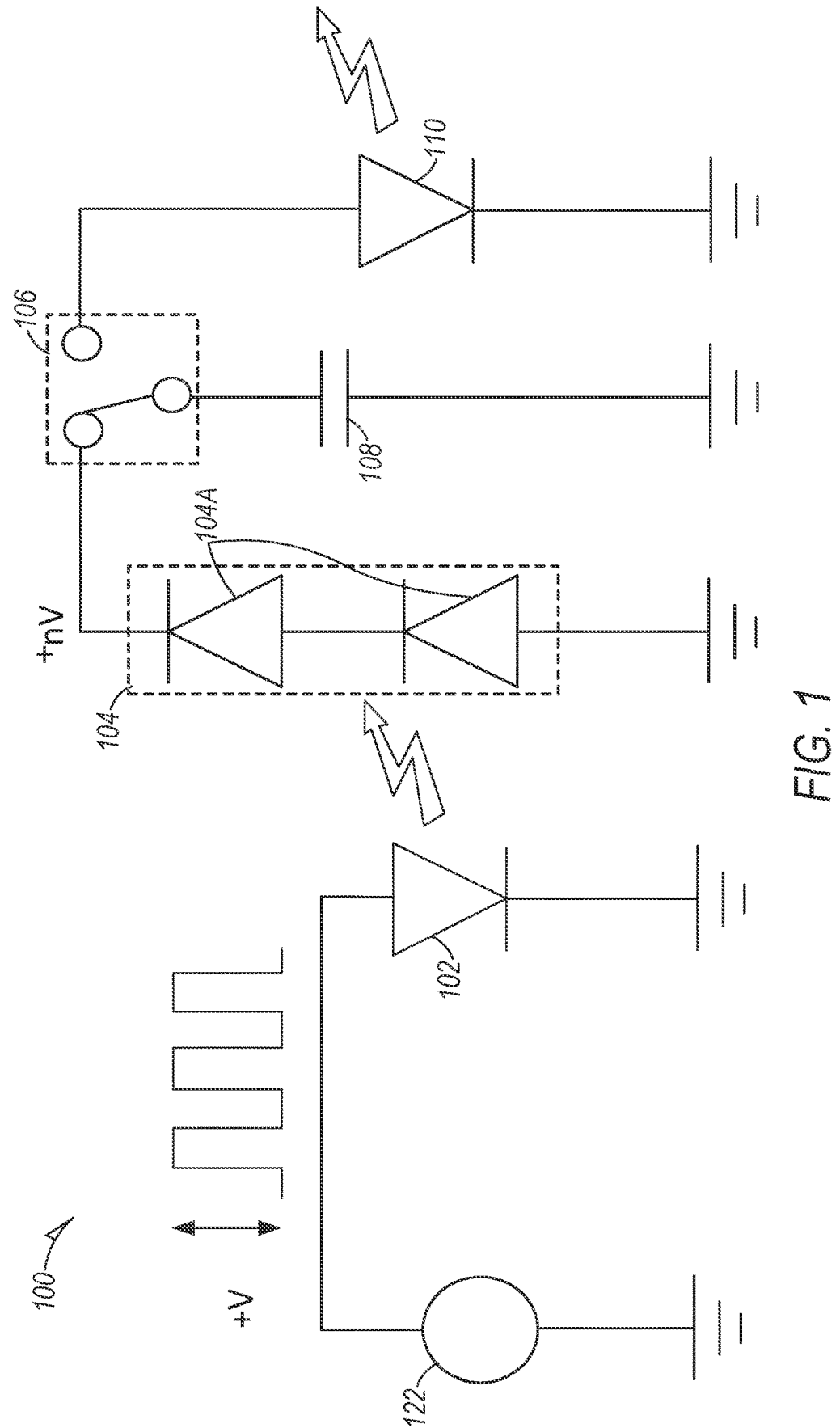
FIG. 1 illustrates an optical step-up transformer system, according to some embodiments.

FIG. 1 illustrates an optical step-up transformer system, according to some embodiments. FIG. 1 shows a simplified optical step-up transformer system 100, in which some elements may not be shown for convenience. As indicated, a pulse width modulation (PWM) signal may be supplied to the light emitter (e.g., a photodiode such as a LED) 102. The PWM signal may span, for example, a 3V range. The PWM signal may be supplied by a voltage source 122. In some embodiments, the voltage source 122 may be a processor or other digital source that is configured to supply the PWM signal, with a predetermined amplitude and duty cycle. The use of a digital source may avoid the use of transistors biased to operate in linear mode, which involves additional biasing and thus battery drain. In other embodiments, the voltage source 122 may be a DC source whose output amplitude may be adjusted by a chopper or other analog circuit to create the PWM signal. The width of the PWM signal (i.e., the duty cycle) may be selectable or may be predetermined. In such embodiments, the optical step-up transformer system 100 may thus include a circuit to regulate the amplitude of the (e.g., DC) voltage source 122. In other embodiments, a DC voltage signal may be provided to the light emitter 102.

The light emitter 102 may include one or more photodiodes, such as the above LEDs, to emit light in a desired wavelength range. The wavelength range may be in the visible spectrum, IR, or UV. In embodiments in which the light emitter 102 includes multiple individual light emitters, the individual light emitters may emit light of the same wavelength or at least one of the individual light emitters may emit light of a different wavelength of at least one other individual light emitter. The individual light emitters may be separately fabricated devices or may be monolithic, formed on the same semiconductor wafer.

The light emitted by the light emitter 102 may be detected by a light detector 104. As shown in FIG. 1, the light emitter 102 may be electrically isolated from, but optically coupled to, the light detector 104. In the optical step-up transformer system 100, power, rather than information may be transmitted between the light emitter 102 and the light detector 104. The light detector 104 may be a single device or, in some embodiments, may contain two or more individual light detectors 104a. In embodiments in which multiple light detectors 104a are present, such as that shown in FIG. 1, the individual light detectors 104a may be, for example, photodiodes connected in series. The photodiodes may be PN photodiodes, PIN photodiodes, avalanche photodiodes, and/ or Schottky photodiodes, for example. In some embodiments, LEDs may be used as photodiodes. Similar to the individual light emitters, the individual light detectors may be separately fabricated devices or may be monolithic, formed on the same semiconductor wafer. Each individual light emitter may have at least one individual detector configured to receive the light from the individual light emitter.

In some embodiments, to increase the amount of photocurrent through the light emitter 102, the light emitter 102 may contain multiple parallel sets of series-connected ones of the individual light detectors 104a, each of which is able to receive light from the light emitter 102. The individual light detectors 104a are connected in series such that an anode of one of the individual light detectors 104a is coupled with a cathode of an adjacent one of the individual light detectors 104a. Whether or not multiple sets are present, the individual light detectors 104a in each string may be the same or at least one of the individual light detectors 104a may be different (and configured to receive light from a different individual light emitter). For example, if one or more InGaN photodiodes are used in the light emitter 102, the InGaN compositions can be varied to generate different voltages. In another example, one or more UV LEDs and UV photodiodes may be used to generate higher voltages. Alternatively, one or more AlInGaP LEDs and photodiodes may be used instead or in addition to generate different voltages. In some embodiments, Si (or SiGe) photodiodes can be used in series.

In the optical step-up transformer system 100 shown in FIG. 1, the series-connected ones of the individual light detectors 104a may be used to increase the voltage supplied to the light emitter 102. In particular, the amplitude of the voltage supplied to the light emitter 102 (shown as +V in FIG. 1) may be multiplied by the number of individual light detectors 104a (shown as +nV in FIG. 1), assuming that V is larger than the turn-on voltage of each individual light detector 104a. +V may be, for example, +3V, the voltage of the battery used in mobile devices. The light detector 104 may be coupled to a switch 106. The switch 106 may connect one or more capacitors 108 to either the light detector 104 or to a secondary light emitter 110.

The output voltage from the light detector 104 may thus be provided to the one or more capacitors 108 to charge the one or more capacitors 108. In response to the one or more capacitors 108 reaching a predetermined charge, such as being charged to the maximum voltage (+nV), the switch 106 may be controlled to disconnect the one or more capacitors 108 from the light detector 104 and connect the one or more capacitors 108 to the secondary light emitter 110. The voltage at the one or more capacitors 108 may be provided to a processor to control the switch 106 based on the provided voltage. The secondary light emitter 110 may be, for example, a camera flash, which may benefit from a higher applied voltage than the nominally available battery voltage. Thus, for example 6V can be generated from 3V circuitry to provide 4V to operate a camera flash or to generate 5V TTL signals or pulses. As the transformer is optical-based, the step-up transform speed may be faster than similar magnetic and electromagnetic transformers. The use of the optical step-up transformer system 100 may also avoid the use of a supercapacitor to increase the voltage to be used for the camera flash. Note that although a camera flash is specifically mentioned, the optical step-up transformer can be used in other circuitry. For example, the optical transformer can be used to power a 5V apparatus within an electronic device running on 2×1.5–V batteries.

Figure 2:
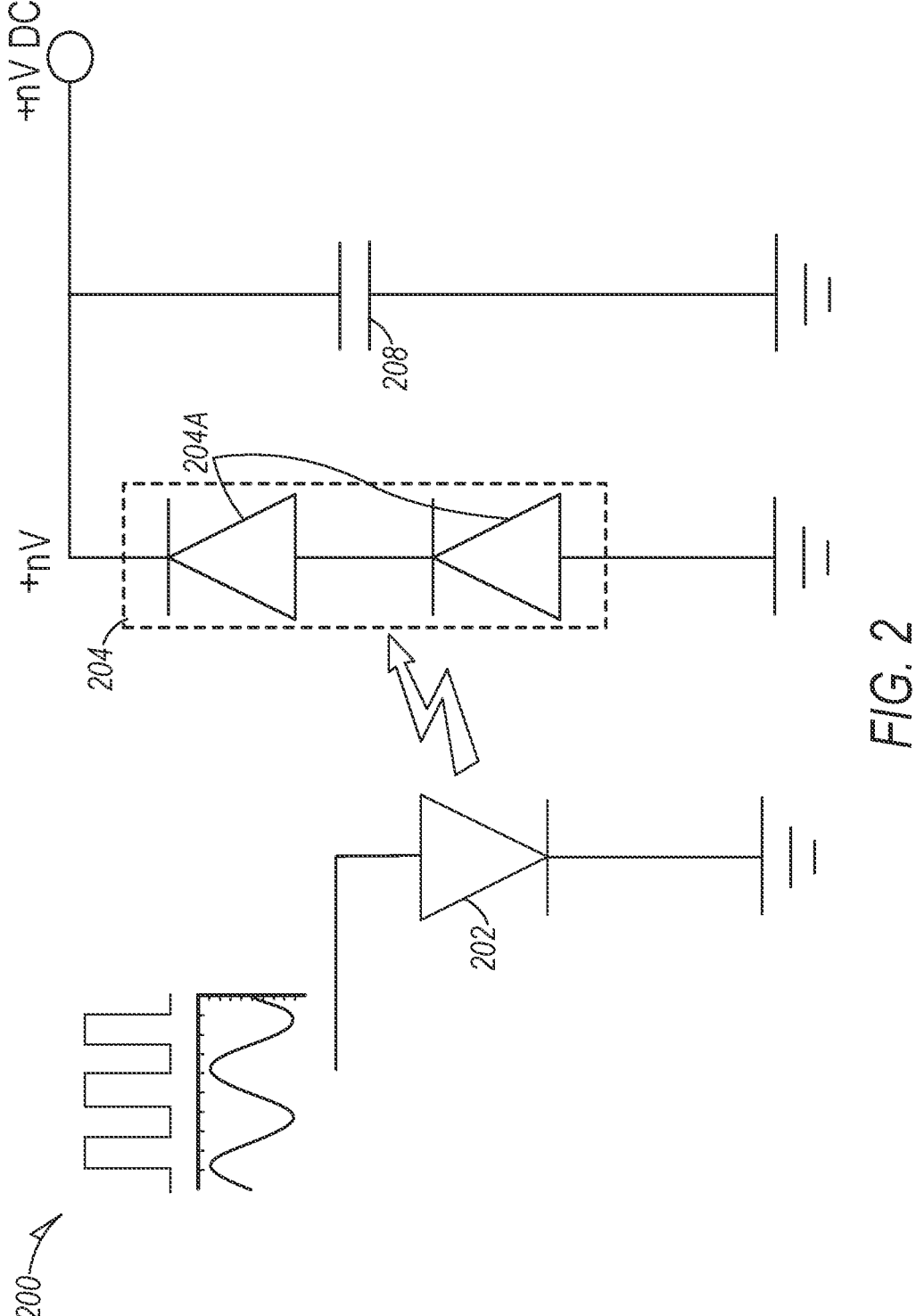
FIG. 2 illustrates another optical step-up transformer system, according to some embodiments.

FIG. 2 illustrates another optical step-up transformer system, according to some embodiments. As above, FIG. 2 shows a simplified optical step-up transformer system 200, in which some elements may not be shown for convenience. As indicated, a PWM or AC signal may be supplied to the light emitter 202. The light emitted by the light emitter 202 may be detected by a light detector 204 that is electrically isolated from, but optically coupled to, the light detector 204. The light detector 204 may contain two or more individual light detectors 204a. Unlike the arrangement of FIG. 1, however, no switch is present; thus, the capacitor

208 may charge continuously and a constant voltage may be present at the output terminal.

Figure 3A:
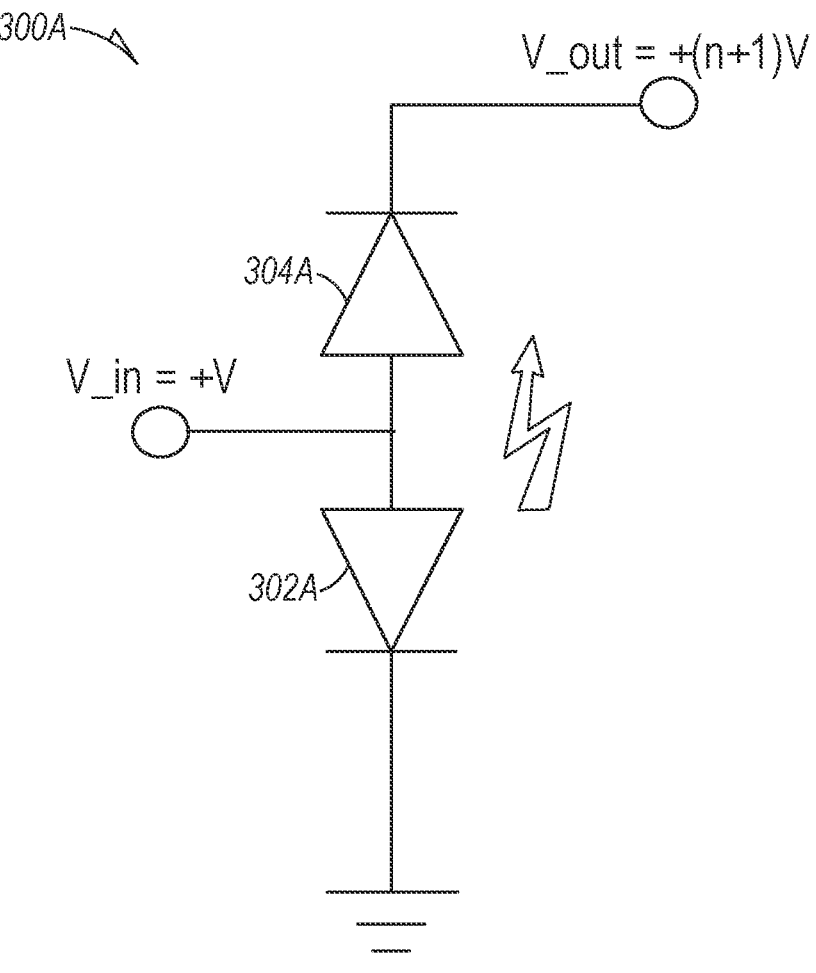
FIG. 3A illustrates another optical step-up transformer system, according to some embodiments.
Figure 3B:
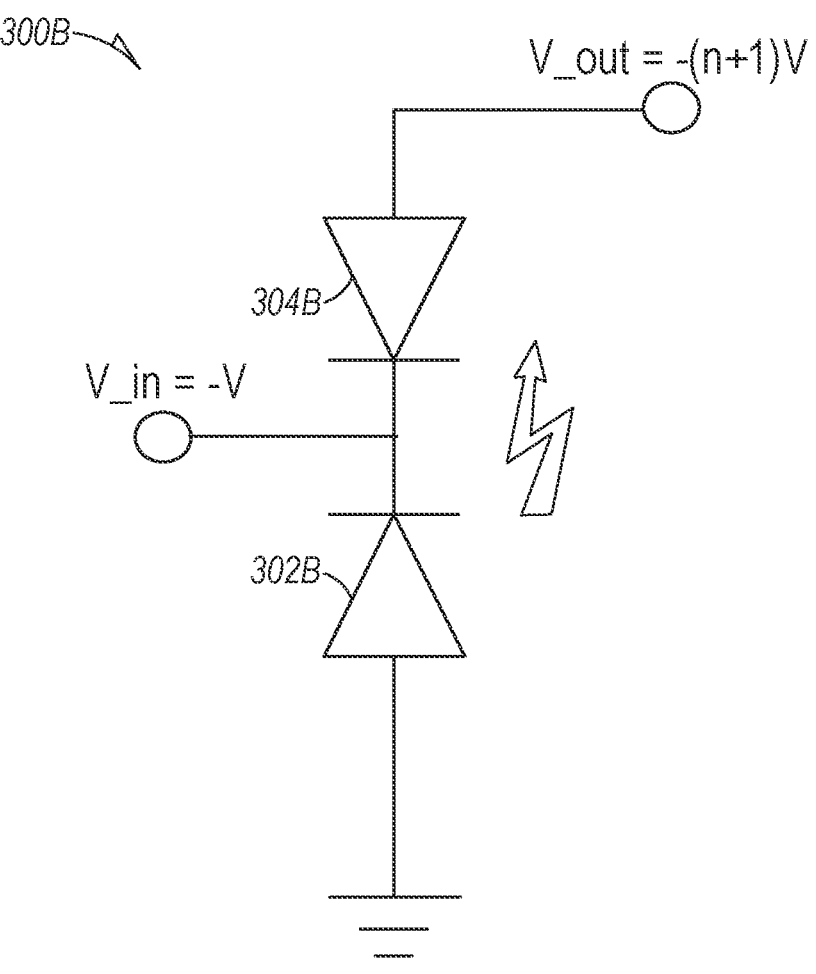
FIG. 3B illustrates another optical step-up transformer system, according to some embodiments.
Figure 3C:
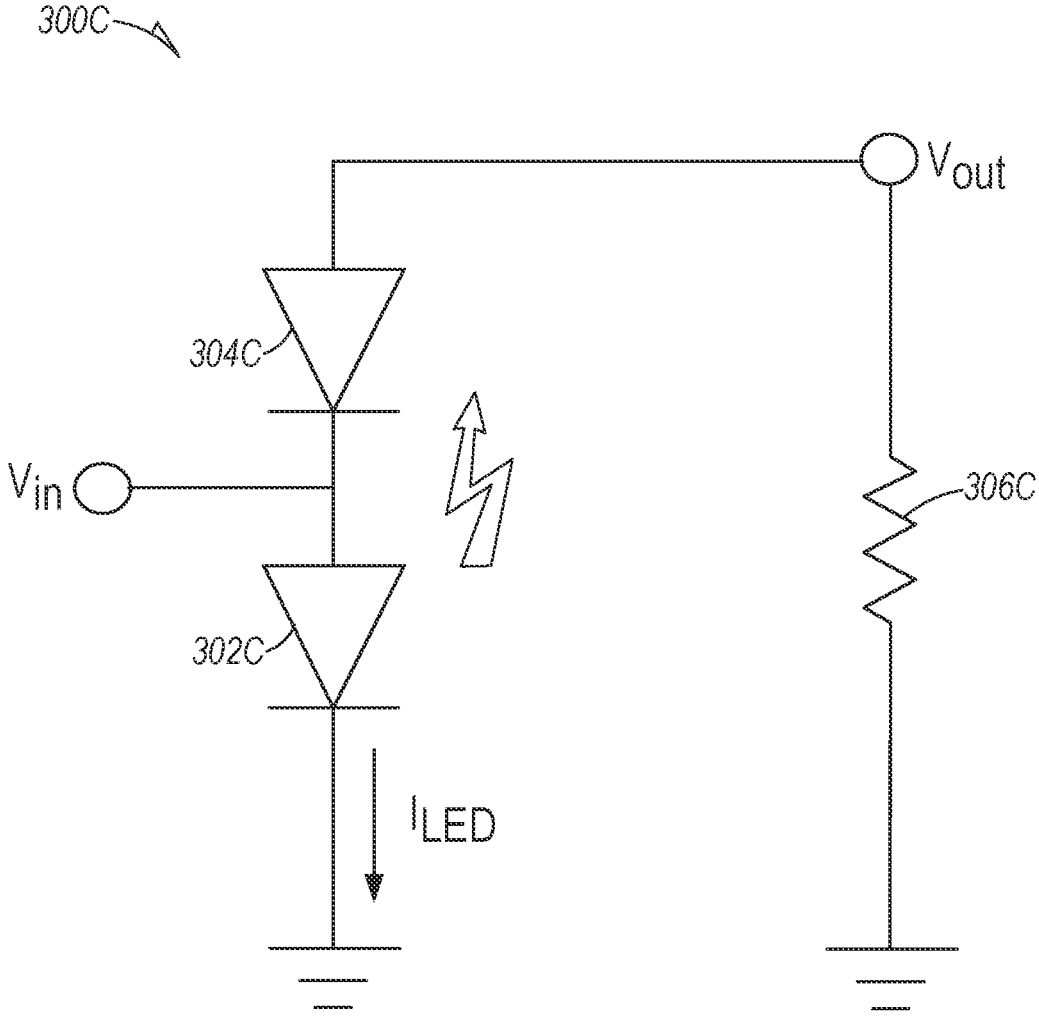
FIG. 3C illustrates another optical step-up transformer system, according to some embodiments.

FIGS. 3A-3C illustrate other optical step-up transformer systems, according to some embodiments. The simplified optical step-up transformer systems 300a, 300b, 300c shown in FIGS. 3A-3C contain similar components: a light emitter 302a, 302b, 302c and a light detector 304a, 304b, 304c. In each of the optical step-up transformer systems 300a, 300b, 300c shown in FIGS. 3A and 3B, the light emitter 302a, 302b, 302c is electrically and optically coupled to the light detector 304a, 304b, 304c. Although not shown in FIGS. 3A-3C, each optical step-up transformer system 300a, 300b, 300c may contain one or more individual light emitters and/or light detectors. In FIG. 3A, the light emitter 302a shares a common anode with the light detector 304a; in FIG. 3B, the light emitter 302b shares a common cathode with the light detector 304b; and FIG. 3C, the anode of the light emitter 302c is coupled to the cathode of the light detector 304c.

Figure 3D:
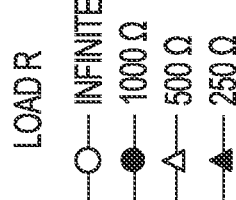
FIG. 3D illustrates a graph of output voltage vs. current for different load resistors for the arrangement of FIG. 3C, according to some embodiments.
Figure 3D:
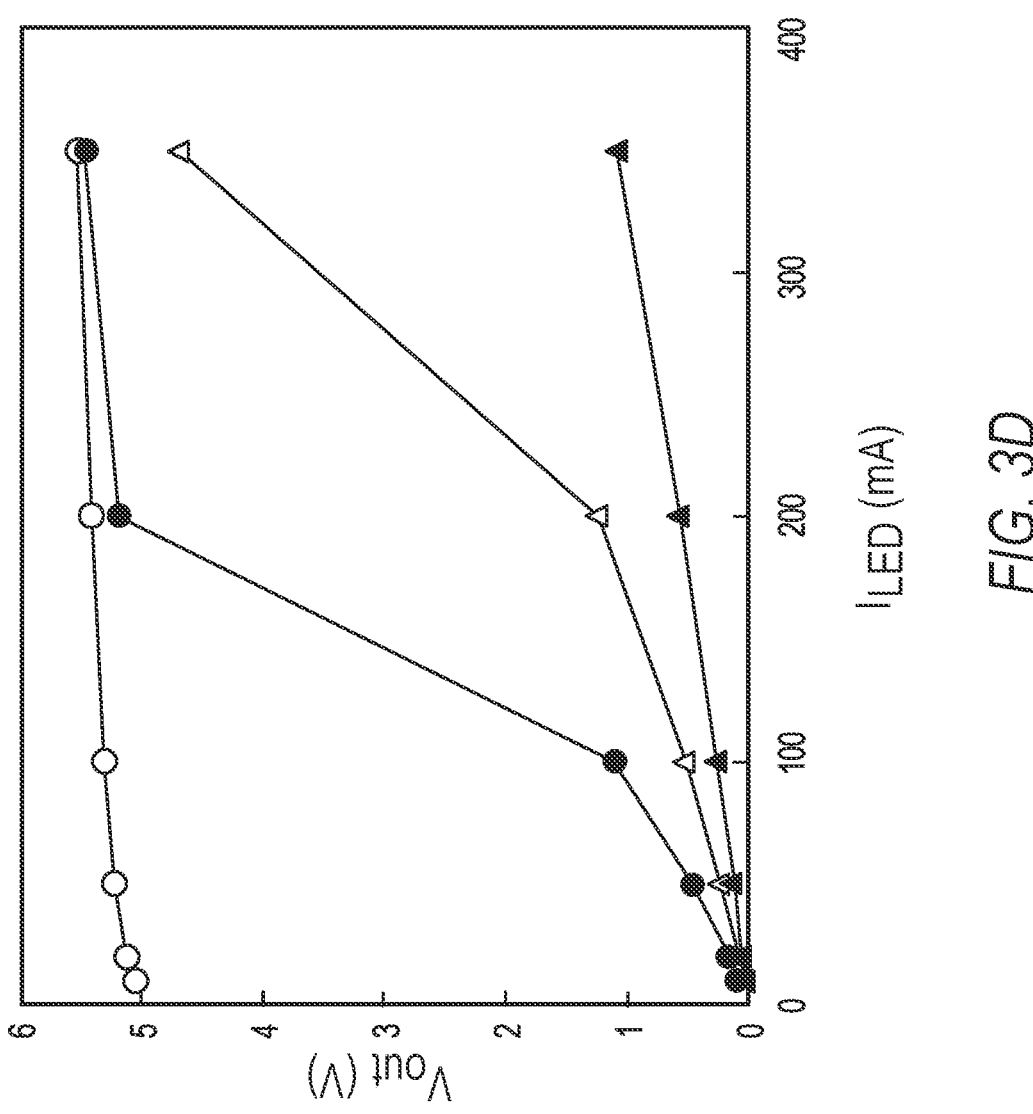

As shown in FIG. 3A, in the embodiment in which the light emitter 302a shares a common anode with the light detector 304a, a positive voltage may be applied to the common anode; while in FIG. 3B, in the embodiment in which the light emitter 302b shares a common cathode with the light detector 304b, a negative voltage may be applied to the common cathode. The output voltage from the optical step-up transformer system 300a may be the input voltage (indicated as +V) plus the input voltage multiplied by the number (n) of individual series-connected light detectors that form the light detector 304a, that is (n+1)V. Similarly, the output voltage from the optical step-up transformer system 300b may be the input voltage (indicated as −V) minus the input voltage multiplied by the number (n) of individual series-connected light detectors that form the light detector 304b, that is −(n+1)V. As shown in FIG. 3C, in the embodiment in which the anode of the light emitter 302c is coupled to the cathode of the light detector 304c, a positive voltage may be applied to the anode of the light emitter 302c, and the anode of the light detector 304c may be coupled to ground via a resistor 306c, which may provide a load. In this case, the output voltage may be taken at the junction between the anode of the light detector 304c and the resistor 306c. FIG. 3D illustrates a graph of output voltage vs. current for different load resistors for the arrangement of FIG. 3C, according to some embodiments.

Figure 4:
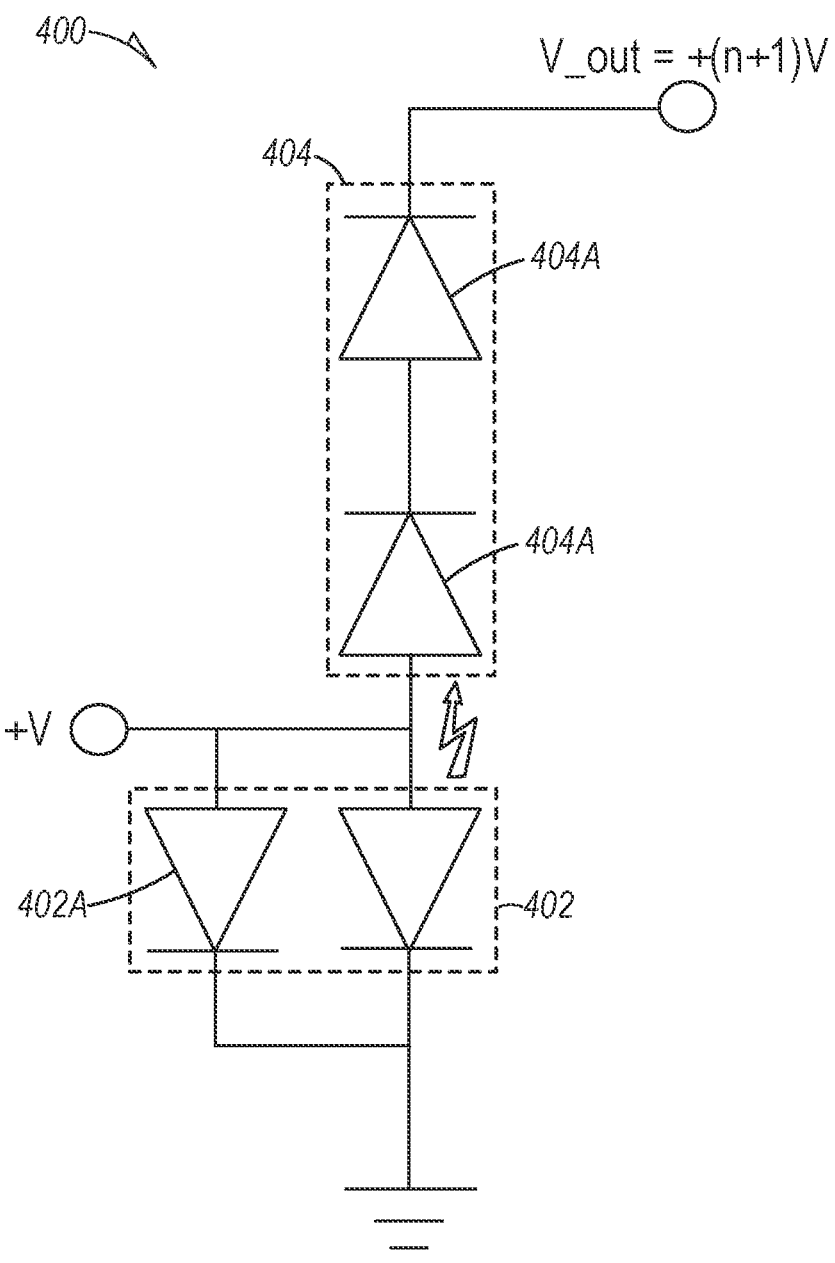
FIG. 4 illustrates another optical step-up transformer system, according to some embodiments.

FIG. 4 illustrates another optical step-up transformer system, according to some embodiments. The simplified optical step-up transformer system 400 is similar to that shown in FIG. 3A and accordingly contains similar components: a light emitter 402 and a light detector 404. In the optical step-up transformer system 400, the light emitter 402 is electrically and optically coupled to the light detector 404. As shown, the optical step-up transformer system 400 may contain multiple individual light emitters 402a and/or multiple individual light detectors 404a. The individual light emitters 402a may be connected in parallel to provide an enhanced amount of light. The individual light detectors 404a may be connected in series for the reasons provided above. The light emitter 402 may share a common anode with the light detector 404. In a different embodiment, the light emitter may share a common cathode with the light detector. Similar to the above discussion related to FIG. 3A, the output voltage from the optical step-up transformer system 400 may be the input voltage (indicated as +V) plus the input voltage multiplied by the number (n) of individual series-connected ones of the multiple individual light detectors 404a that form the light detector 404, that is (n+1)V.

Figure 5:
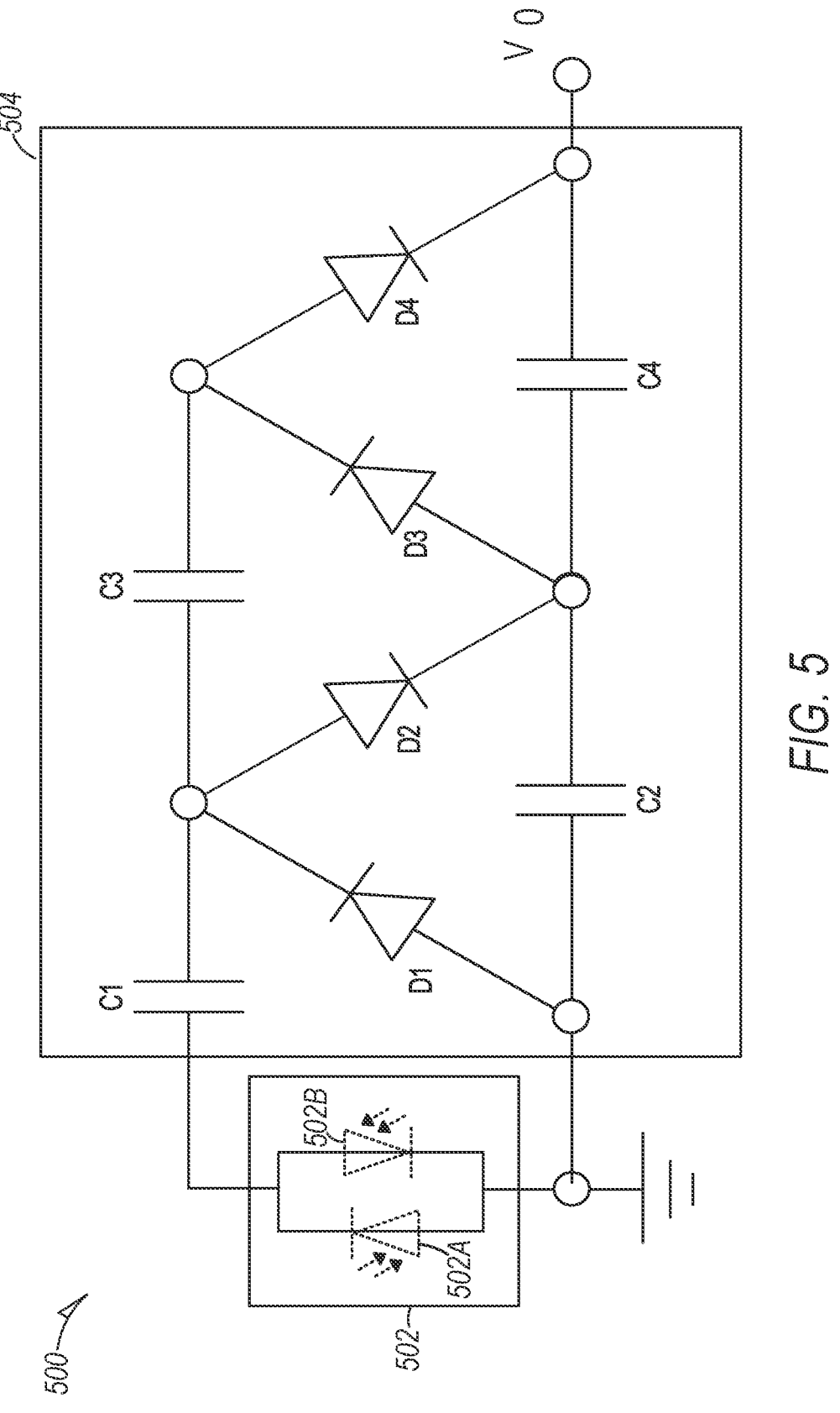
FIG. 5 illustrates an optical step-up transformer use, according to some embodiments.

FIG. 5 illustrates an optical step-up transformer use, according to some embodiments. The optical application 500 shown includes an optical transformer 502 and a Cockcroft-Walton multiplier 504. The optical transformer 502 may be similar to any of the optical transformers shown in FIGS. 1-4. However, as shown, the optical transformer 502 may contain a pair of light detectors 502a, 502b. The pair of light detectors 502a, 502b are connected in parallel and in opposite directions; that is, the anode of one of the pair of light detectors 502a, 502b is connected with the cathode of the other of the pair of light detectors 502a, 502b. The use of a pair of light detectors 502a, 502b that are oppositely coupled to the Cockcroft-Walton multiplier 504 (i.e., the anode of one is coupled to the same terminal as the cathode of the other). This permits the pair of light detectors 502a, 502b to be driven alternately by the same or different light emitter(s) and to correspondingly provide a stable constant output at the Cockcroft-Walton multiplier 504. The pair of light detectors 502a, 502b may receive light from different sets of light emitters that are driven by PWM signals that are out of phase with each other (e.g., 1800 out of phase when the PWM duty cycle is 0.5). As above, each of the pair of light detectors 502a, 502b may have one or more individual light detectors. In some embodiments, optics may be used to direct the light to the different light detectors 502a, 502b; for example, a routing path of the light from the light emitter may be switched to be received between light detectors 502a, 502b at different times so that the light is provide to each of the light detectors 502a, 502b is out of phase. The use of a Cockcroft-Walton multiplier 504 in conjunction with the optical transformer 502 may allow a relatively small voltage to be stepped up to voltages for a wide variety of applications, such as those to provide charged particles (e.g., an ionizer or paint gun.

Figure 6B:
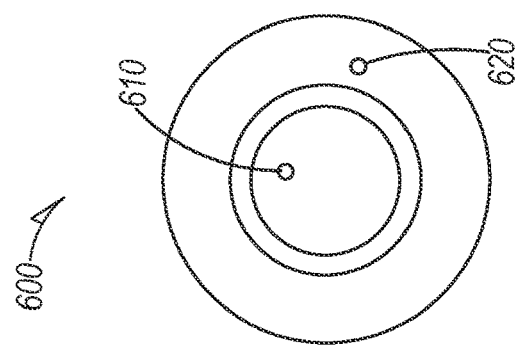
FIG. 6B illustrates a simplified top view of the optical step-up transformer of FIG. 6A, according to some embodiments.
Figure 6A:
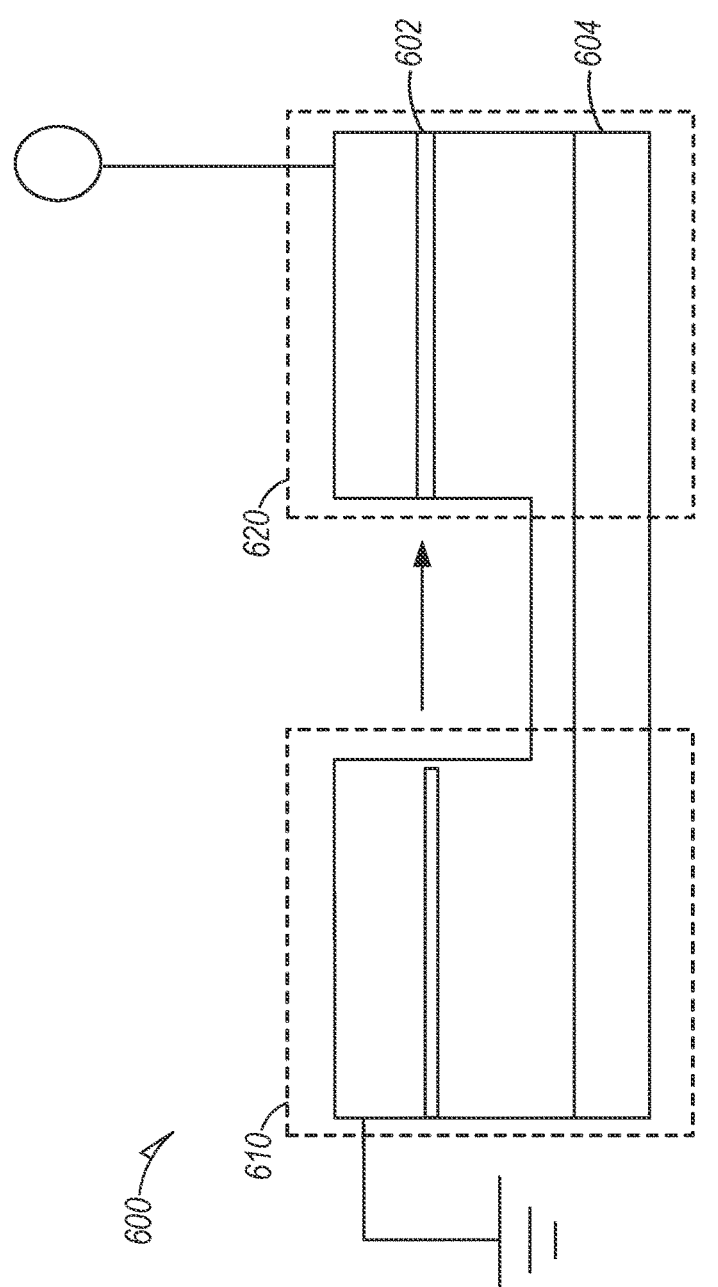
FIG. 6A illustrates a simplified partial cross-sectional view of an optical step-up transformer, according to some embodiments.

FIG. 6A illustrates a simplified partial cross-sectional view of an optical step-up transformer, according to some embodiments. FIG. 6B illustrates a simplified top view of the optical step-up transformer of FIG. 6A, according to some embodiments. The structure 600 shown may be fabricated using semiconductor processes including, for example, chemical vapor deposition to deposit active semiconductor layers, oxide growth, photolithography, etching (e.g., to form vias), metal deposition (e.g., to form contacts), and passivation (e.g., to treat surfaces), among others. The structure 600 may have separate devices fabricated therein, as shown including a light emitter 610 and light receiver 620, such as those described above. The structure 600 may include a substrate 604 on which the active semiconductor layers 602 are grown epitaxially. The substrate 604 may be formed from sapphire, for example. The active semiconductor layers 602 generate light when voltage is applied thereto in the light emitter 610 or receive the light generated by the light emitter 610 in the light receiver 620. The active semiconductor layers 602 within the light emitter 610 and the light receiver 620 may be the same. The light emitter 610 and the light receiver 620 may be coupled together to have a common cathode.

As shown in the top view of FIG. 6B, the light emitter 610 may be substantially circular and the light receiver 620 may be substantially annular and completely surround the light emitter 610. The light emitter 610 and light receiver 620 may be separated in a radial direction by about a few microns to a few mm. The use of a light receiver 620 that completely surrounds the light emitter 610 may increase or maximize the light received by the light receiver 620 that is emitted by the light emitter 610. Although only one light emitter 610 is shown, multiple light emitters may be present.

Figures 7A, 7B:
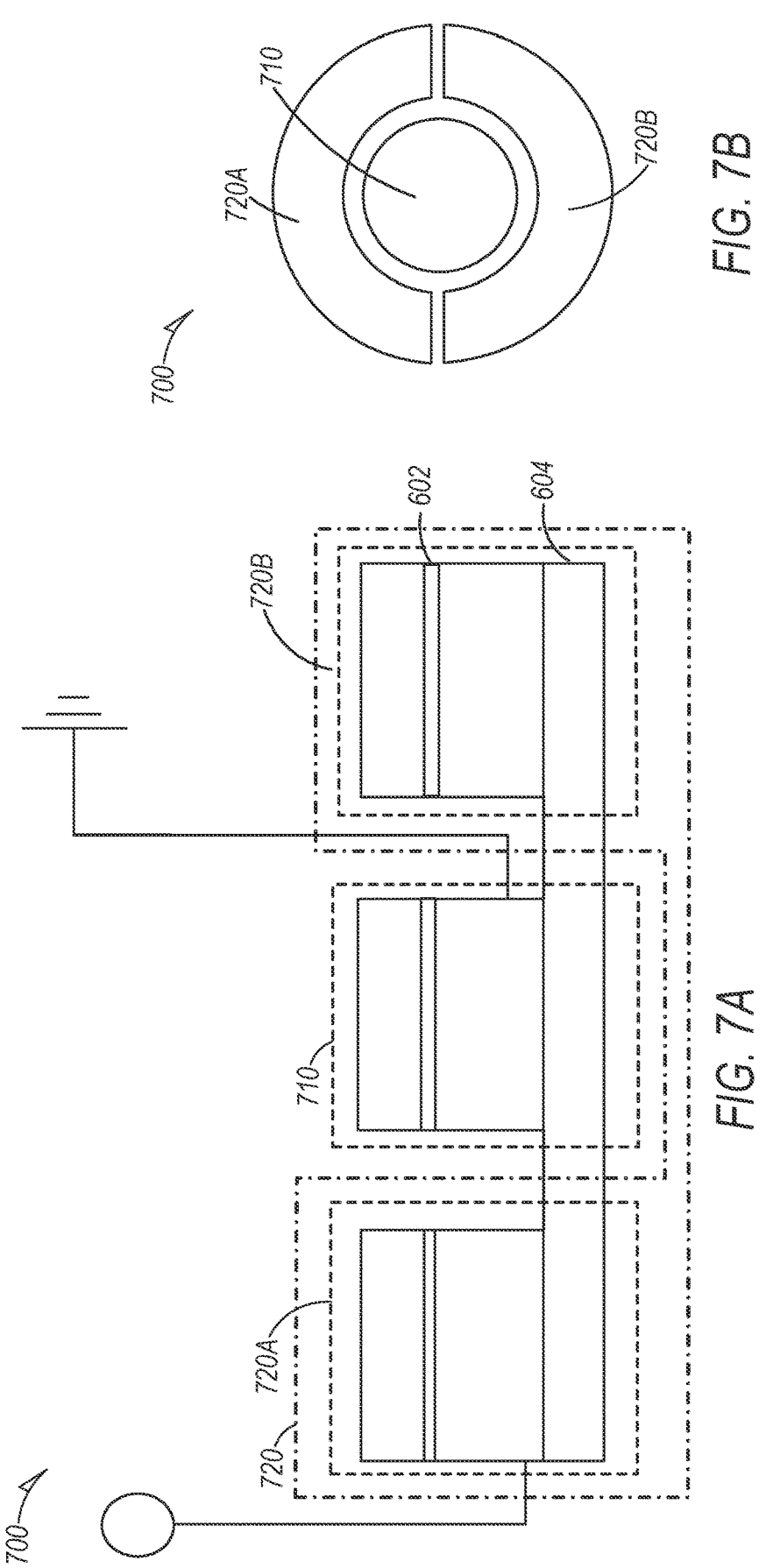
FIG. 7A illustrates a simplified cross-sectional view of an optical step-up transformer, according to some embodiments.
FIG. 7B illustrates a simplified top view of the optical step-up transformer of FIG. 7A, according to some embodiments.

FIG. 7A illustrates a simplified cross-sectional view of an optical step-up transformer, according to some embodiments. FIG. 7B illustrates a simplified top view of the optical step-up transformer of FIG. 7A, according to some embodiments. The structure 700 shown may be fabricated using the semiconductor processes above. The structure 700 may have separate devices fabricated therein, as shown a light emitter 710 and light receiver 720, such as those described above. The light receiver 720 may have multiple individual light receivers 720a, 720b that are electrically connected or coupled together in series. The structure 700 may include a substrate 704 on which the active semiconductor layers 702 are grown epitaxially. The substrate 704 may be formed from GaN, for example. The active semiconductor layers 702 generate light when voltage is applied thereto in the light emitter 710 or receive the light generated by the light emitter 710 in the light receiver 720. The active semiconductor layers 702 within the light emitter 710 and the light receiver 720 may be the same. The light emitter 710 and the light receiver 720 may be coupled together to have a common anode.

As shown in the top view of FIG. 7B, the light emitter 710 may be substantially circular and the individual light receiver 720a, 720b may be substantially semi-circular and completely or nearly completely surround the light emitter 710, other than segmentation to separate the individual light receiver 720a, 720b. The light emitter 710 and light receiver 720 may be separated in a radial direction by about a few microns to a few mm. Although only one light emitter 710 is shown, multiple light emitters may be present.

Figure 8:
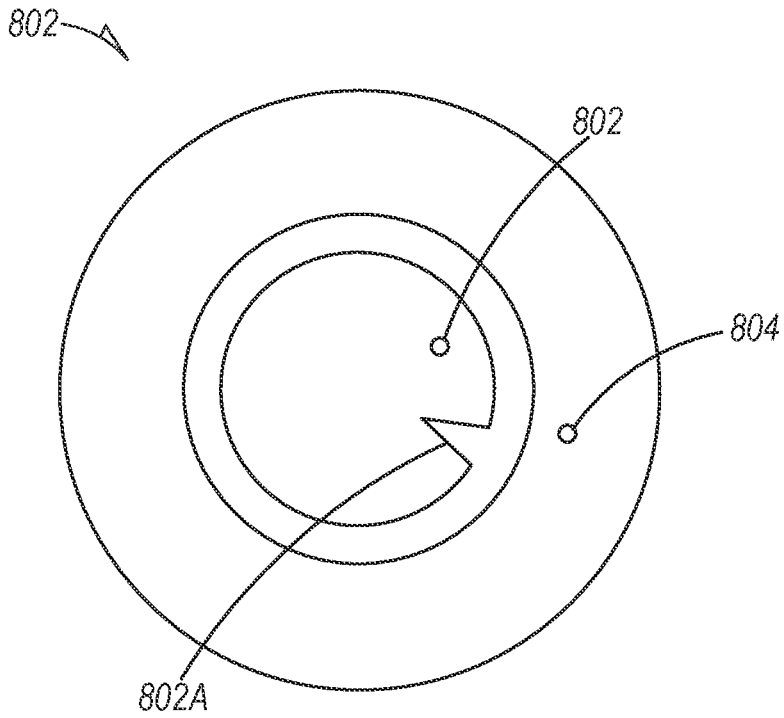
FIG. 8 illustrates a simplified top view of another optical step-up transformer, according to some embodiments.

FIG. 8 illustrates a simplified top view of another optical step-up transformer, according to some embodiments. The optical step-up transformer 800 of FIG. 8 is similar to that shown in FIG. 6A. As shown in FIG. 8, the light emitter 802 may be substantially circular and the light receiver 804 may be substantially annular and completely surround the light emitter 802. The light emitter 802 and light receiver 804 may be separated in a radial direction by about a few microns to a few mm. Unlike the arrangement in FIG. 6A, the light emitter 802 may have a notch 802a. As shown, the notch 802a is substantially pie-shaped, but may be formed in a variety of shapes, such as semi-circular, to suppress a whispering gallery mode (a wave that can travel around a concave surface) within the optical step-up transformer 800.

Figure 9:
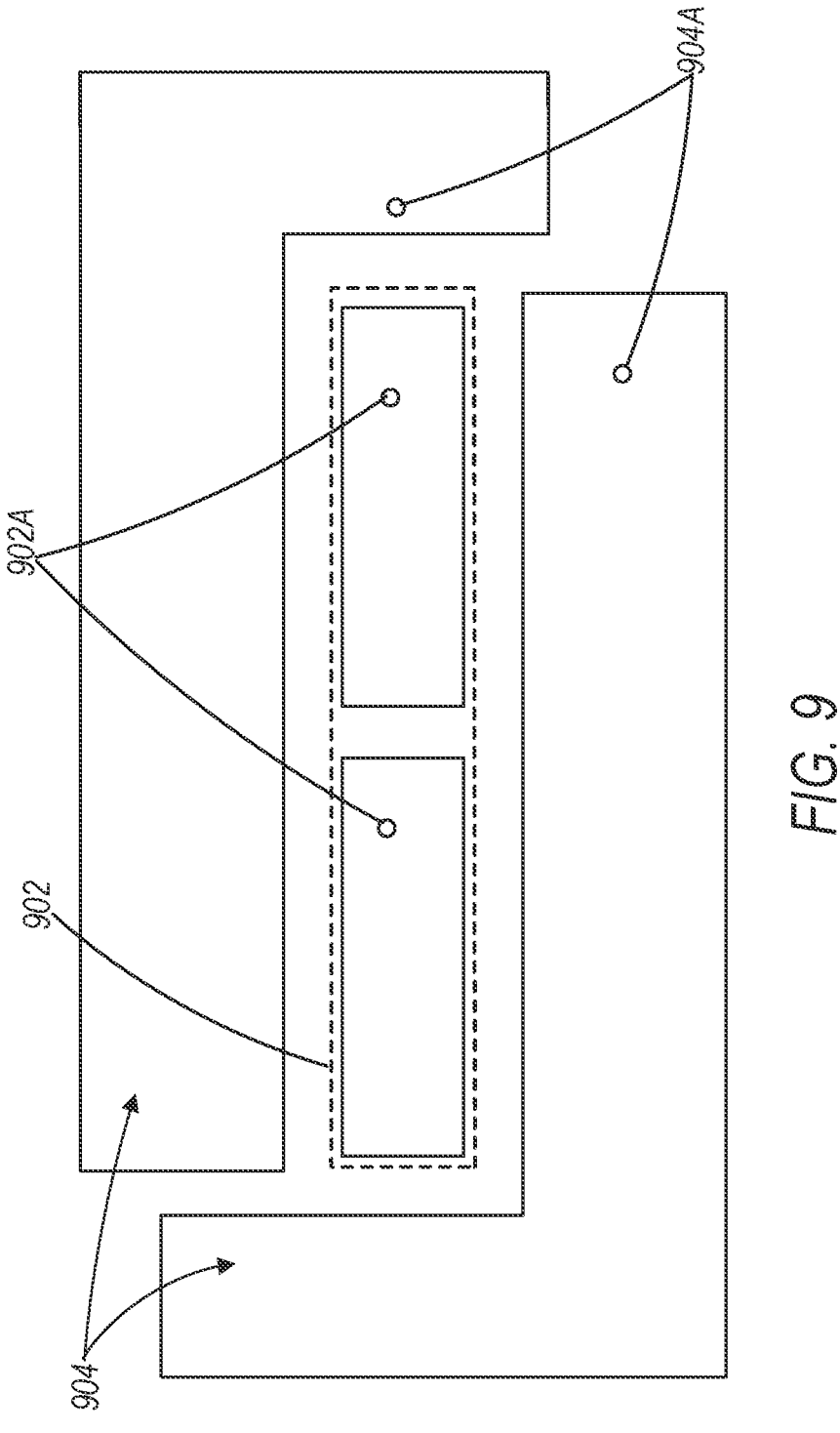
FIG. 9 illustrates a simplified top view of another optical step-up transformer, according to some embodiments.

FIG. 9 illustrates a simplified top view of another optical step-up transformer, according to some embodiments. Similar to the previous arrangements, the optical step-up transformer 900 of FIG. 9 contains a light emitter 902 and light receiver 904 that completely surrounds the light emitter 902. In this embodiment, however, both the light emitter 902 and light receiver 904 may be segmented; the light emitter 902 may have two or more individual light emitters 902a and the light receiver 904 may have two or more individual light receivers 904a. The individual light emitters 902a may be substantially rectangular and may be colinear. The use of individual light emitters 902a may reduce self-absorption of the light emitted by the light emitter 902. Self absorption by the active layer may occur significantly when emitted light is trapped within the active layer. A long rectangle may trap light because of its geometrical shape, a long bar cavity. By segmenting this bar, the degree of self absorption may be reduced as there is less active volume within a section. Right angles may increase geometrical symmetry that leads more light trapping, so, for example, the use of a Brewster angle (or any angle in fact) may aid to limit the trapping of light. In other embodiments, the individual light emitters 902a may be formed from different shapes to enhance emission characteristics. For example, one or more of the individual light emitters 902a may be trapezoids; one or both ends of each of the individual light emitters 902a may have a Brewster angle rather than a right angle to enhance light extraction and to suppress longitudinal modes. The individual light receivers 904a may be "L" shaped and substantially completely surround the light emitter 902 in a symmetric manner. The individual light emitters 902a may be connected in parallel; the individual light receivers 904a may be connected (coupled) in series. The light emitter 902 and light receiver 904 may be separated in a radial direction by about a few microns to a few mm.

Figure 10:
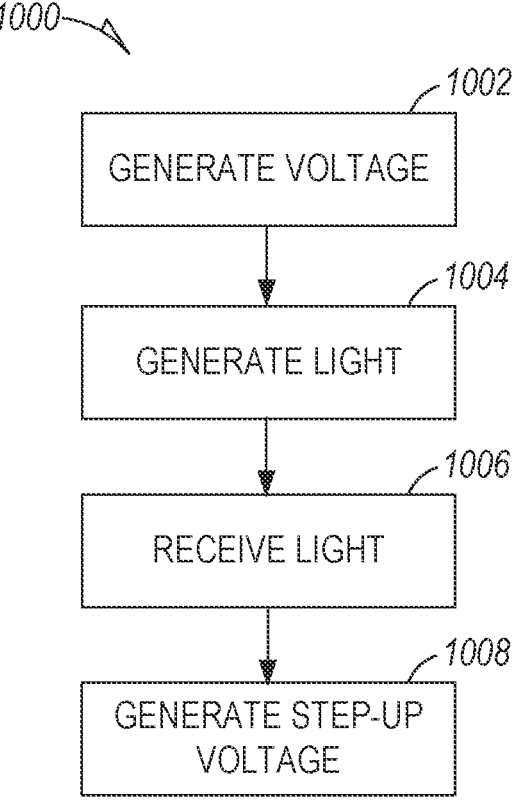
FIG. 10 illustrates an example method of operation of the optical step-up transformer, according to some embodiments.

FIG. 10 illustrates an example method of operation of the optical step-up transformer, according to some embodiments. Not all of the operations may be undertaken in the method 1000 of FIG. 10, and/or additional operations may be present. Prior to operating the optical step-up transformer of any or all of the previously-described embodiments, the light emitter and light detector of the optical step-up transformer are fabricated using the above semiconductor fabrication processes, the light emitter and light detector are coupled to the driving circuitry and perhaps output circuitry. In some embodiments, the light emitter and light detector may be optically coupled but not electrically coupled, while in other embodiments the light emitter and light detector are coupled both optically and electrically, as described in more detail above. The light emitter and/or the light detector may be one or more LEDs. The light emitter and the light detector may be fabricated to be monolithic or may be fabricated at different times using different substrates. Regardless of the manner in which fabrication has occurred, the light emitter and the light detector may be disposed in close proximity to each other (e.g., in the micron to mm range) to enable efficient or improved capture of the light from the light emitter by the light detector.

In operation 1002, a voltage may be generated by the driving circuitry and applied to the light emitter. The voltage may be, for example, a PWM signal provided from analog circuitry or digital circuitry (e.g., a processor). In response to receiving the voltage, which is larger than a turn-on voltage of the light emitter, the light emitter may, at operation 1004, generate light of a predetermined wavelength. The light generated by the light emitter may, at operation 1006, be received by the light detector. The received light may have sufficient energy to excite electrons across the bandgap in the light emitter and thus generate a voltage at least as large as the turn-on voltage of the light emitter. The received light may be used by the light emitter to generate the step-up voltage at operation 1008 and an output of the optical step-up transformer. The output of the optical step-up transformer may be dependent on the voltage provided to the light emitter and/or to the turn-on voltage of the light emitter. In some embodiments, when the light emitter contains multiple individual series-connected light emitters that all receive the light from the light emitter, the step-up voltage may be proportional to the number of individual series-connected light emitters. The output from the optical step-up transformer may be used to drive electronics, such as a camera flash, or other devices that use a higher voltage than the voltage available to be provided to the light emitter.

Figure 11:
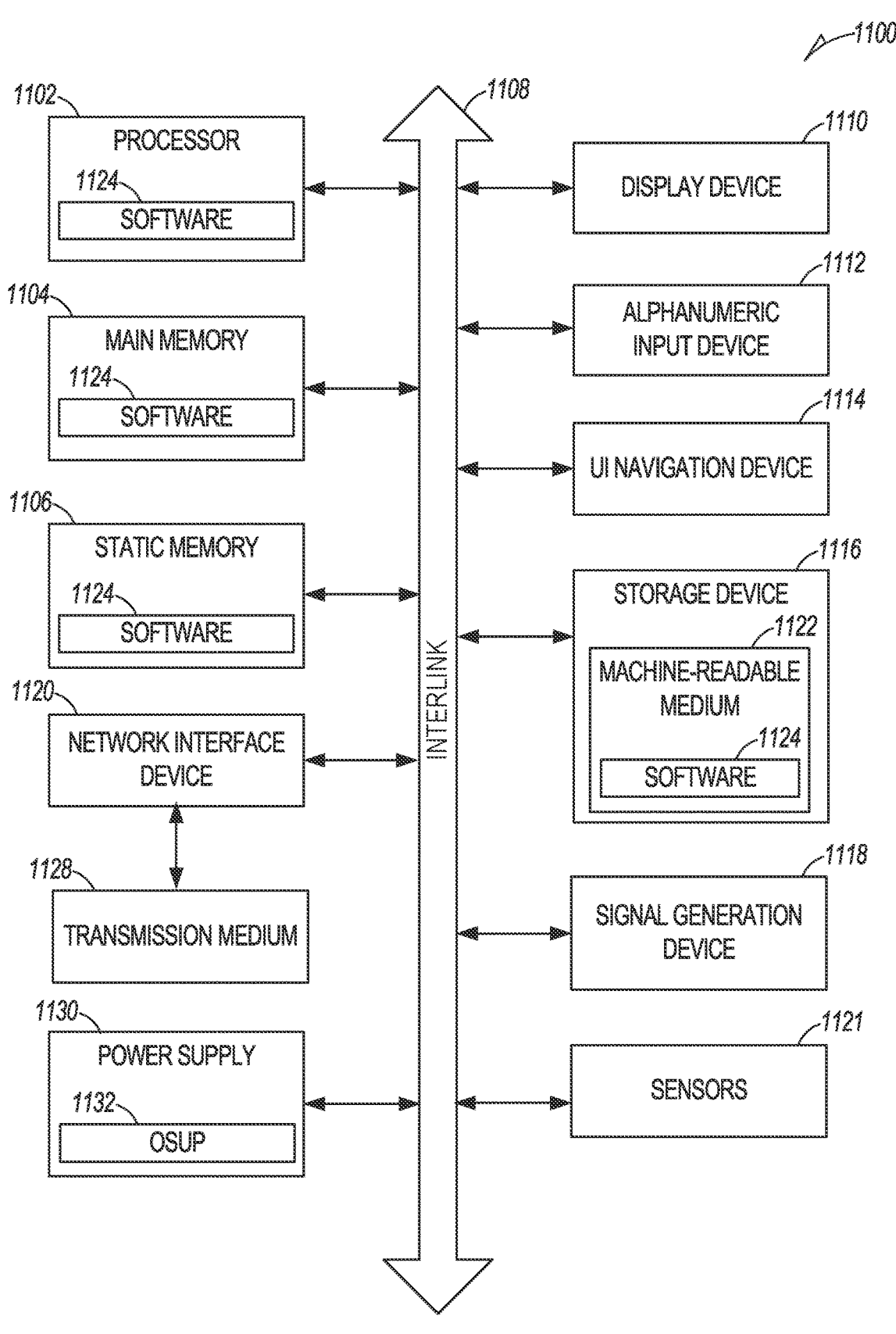
FIG. 11 illustrates a block diagram of a communication device that uses an optical step-up transformer, according to some embodiments.

FIG. 11 illustrates a block diagram of a communication device in accordance with some embodiments. The communication device 1100 may be a mobile device such as a smart phone. Examples, as described herein, may include, or may operate on, logic or a number of components, modules, or mechanisms. Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The communication device 1100 may include a hardware processor (or equivalently processing circuitry) 1102 (e.g., a central processing unit (CPU), a GPU, a hardware processor core, or any combination thereof), a main memory 1104 and a static memory 1106, some or all of which may communicate with each other via an interlink (e.g., bus) 1108. The main memory 1104 may contain any or all of removable storage and non-removable storage, volatile memory or non-volatile memory. The communication device 1100 may further include a display unit 1110 such as a video display, an alphanumeric input device 1112 (e.g., a keyboard), and a user interface (UI) navigation device 1114 (e.g., a mouse). In an example, the display unit 1110, input device 1112 and UI navigation device 1114 may be a touch screen display. The display unit 1110 may contain one or more cameras and/or flashes, each of which (like the other circuitry described in FIG. 11) may be powered by the power supply 1130 or the optical step-up transformer 1132. The communication device 1100 may additionally include a storage device (e.g., drive unit) 1116, a signal generation device 1118 (e.g., a speaker), a network interface device 1120, and one or more sensors 1126, such as a global positioning system (GPS) sensor, compass, accelerometer, or other sensor. The communication device 1100 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1116 may include a non-transitory machine readable medium 1122 (hereinafter simply referred to as machine readable medium) on which is stored one or more sets of data structures or instructions 1124 (e.g., software) embodying or utilized by any one or more of the techniques or functions described herein. The instructions 1124 may also reside, completely or at least partially, within the main memory 1104, within static memory 1106, and/or within the hardware processor 1102 during execution thereof by the communication device 1100. While the machine readable medium 1122 is illustrated as a single medium, the term "machine readable medium" may include a single medium or multiple media (e.g., a centralized or distributed database, and/or associated caches and servers) configured to store the one or more instructions 1124.

The term "machine readable medium" may include any medium that is capable of storing, encoding, or carrying instructions for execution by the communication device 1100 and that cause the communication device 1100 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Radio access Memory (RAM); and CD-ROM and DVD-ROM disks.

The instructions 1124 may further be transmitted or received over a communications network using a transmission medium 1128 via the network interface device 1120 utilizing any one of a number of wireless local area network (WLAN) transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.15.4 family of standards, a Long Term Evolution (LTE) family of standards, a Universal Mobile Telecommunications System (UMTS) family of standards, peer-to-peer (P2P) networks, a next generation (NG), $5^{th}$ generation (5G) standards among others. In an example, the network interface device 1120 may include one or more physical jacks (e.g., Ethernet, coaxial, or phone jacks) or one or more antennas to connect to the transmission medium 1128.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Figure 12:
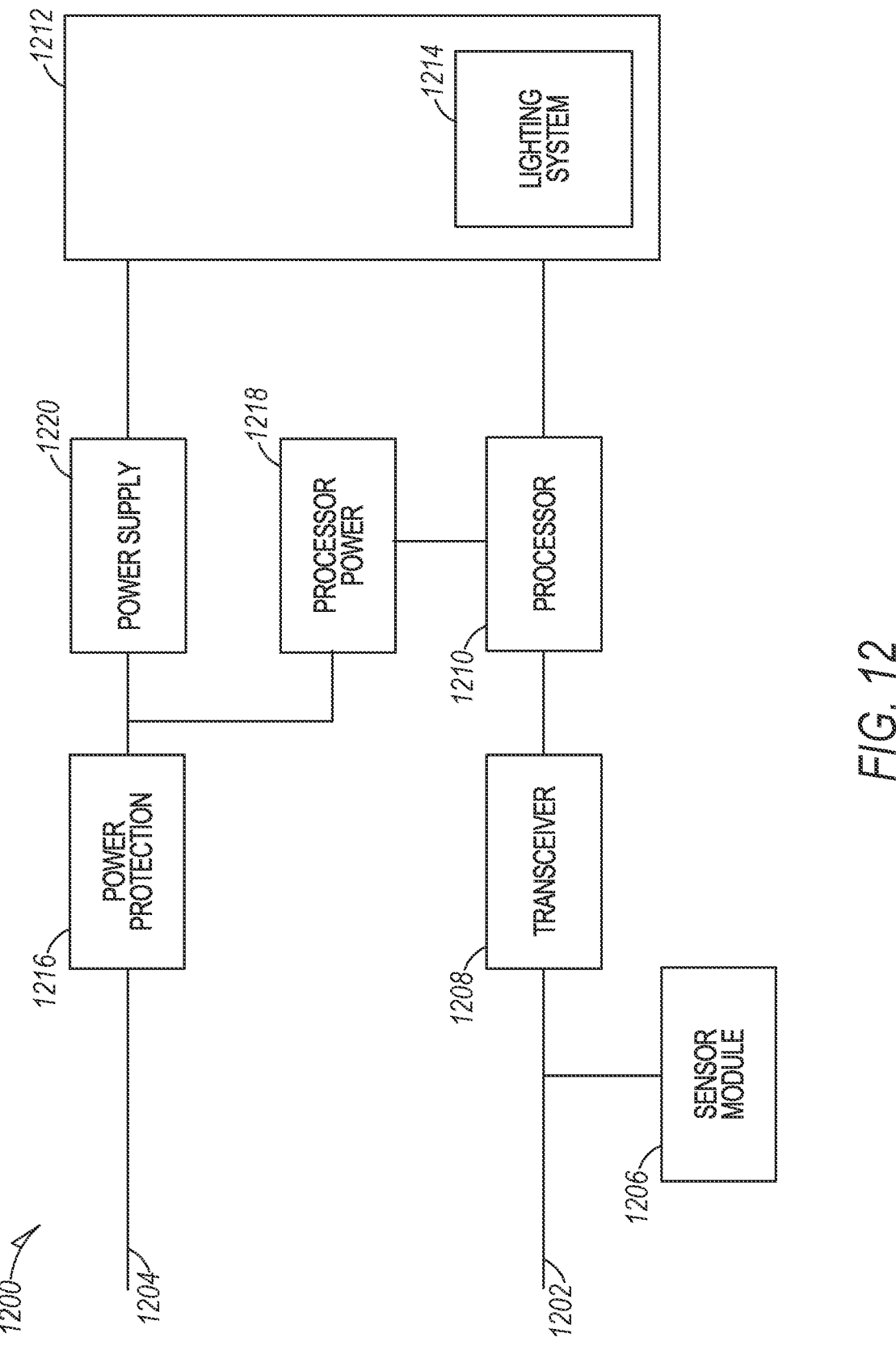
FIG. 12 illustrates an example system 1200, according to some embodiments.

FIG. 12 illustrates an example system 1200, according to some embodiments. In some of the embodiments, not all of the components shown in FIG. 12 may be present. The system 1200 may be provided in, for example, a mobile device or any other apparatus for indoor or outdoor lighting arrangements. In some embodiments, the system 1200 may also be used, in some examples, in an active headlamp system, an augmented reality, or a virtual reality device. In any of these applications, an image provided by the light output by the system 1200 may be provided using the optical step up transformer described herein.

The system 1200 may be coupled to a bus 1202 of the apparatus and a power source 1204. The power source 1204 may provide power for the system 1200 and may include the optical step up transformer. The bus 1202 may be coupled to one or more components that can provide data and/or utilize data provided to the system 1200. The data provided on the bus 1202 may include, for example, image data of an image to be displayed, user control data (e.g., brightness, contrast adjustments), data related to external system sensors, such as environment conditions around the system 1200 (such as a time of day, whether there is rain, whether there is fog, ambient light levels, and other environmental data), among others. When the system 1200 is in a vehicle and the lighting is provided for internal cabin lighting or display, for example, the data provided on the bus 1202 may also be related conditions of the vehicle (such as whether the vehicle is parked, whether the vehicle is in motion, a current speed of the vehicle, a current direction of travel of the vehicle), and/or presence/positions of other vehicles or pedestrians around the vehicle. The system 1200 may provide feedback (such as information regarding operation of the system) to the components shown or other components of the device in which the system 1200 resides.

The system 1200 may further comprise a sensor module 1206. In some embodiments, the sensor module 1206 may include one or more sensors that can sense surroundings of the system 1200. For example, the one or more sensors may sense surroundings that can affect an image to be produced by light emitted by the system 1200. In embodiments in which the system 1200 is disposed in a vehicle for example, the sensors may sense environmental conditions around the vehicle, and/or presence/positions of other vehicles or pedestrians around the vehicle if not already provided. In other embodiments, such as when the system 1200 is disposed in a mobile device, the sensor module 1206 may include one or more of an accelerometer, gyroscope, magnetometer, GPS, proximity sensor, ambient light sensor, microphone, touchscreen sensor, among others. The sensor module 1206 may operate in combination with the data provided on the bus 1202 or may operate in lieu of a portion of the data being provided on the bus 1202. The sensor module 1206 may output visually (and/or audibly and/or tactilely) data indicating that has been sensed by the sensors.

The system 1200 may further include a transceiver 1208. The transceiver 1208 may have a universal asynchronous receiver-transmitter (UART) interface or a serial peripheral interface (SPI) in some embodiments. The transceiver 1208 may also be coupled to the bus 1202 and the sensor module 1206. The transceiver 1208 may receive data from the bus 1202 and the sensor module 1206. In some embodiments, the transceiver 1208 may multiplex the data received from the bus 1202 and the sensor module 1206. The transceiver 1208 may direct feedback to the bus 1202 or the sensor module 1206.

The system 1200 may further include a processor 1210. The processor 1210 may be a hardware processor (single or multiple core) that is coupled to the transceiver 1208. The processor 1210 may exchange data with the transceiver 1208. For example, the processor 1210 may receive data from the transceiver 1208 that was provided by the bus 1202 and/or the sensor module 1206. The processor 1210 may generate image data that indicates an image to be produced by light emitted from the system 1200. The processor 1210 may further generate one or more inquiries that request information from one or more of the components (shown or not shown) of the system 1200. The processor 1210 may further provide the feedback to the transceiver 1208 to be directed to the bus 1202 and/or the sensor module 1206.

The system 1200 may further include an illumination device 1212. The illumination device 1212 may produce multiple different outputs of light. The illumination device 1212 may include a lighting system 1214 that contains, for example, a micro-LED array (which may be several tens of thousands or more individual micro-LEDs and may be individually controlled or controlled in groups of micro-LEDs). The illumination device 1212 may be coupled to the processor 1210 and may exchange data with the processor 1210. In particular, the lighting system 1214 may be coupled to the processor 1210 and may exchange data with the processor 1210. The lighting system 1214 may receive the image data and inquiries from processor 1210 and may provide feedback to the processor 1210.

The system 1200 may further include power protection 1216. The power protection 1216 may be coupled to the power source 1204 and may receive power from the power source. The power protection 1216 may include one or more filters that may reduce conducted emissions and provide power immunity. In some embodiments, the power protection 1216 may provide electrostatic discharge (ESD) protection, load-dump protection, alternator field decay protection, reverse polarity protection, or some combination thereof.

The system 1200 may further include processor power 1218. The processor power 1218 may be coupled to the power protection 1216 and may receive power from the power source 1204. The processor power 1218 may comprise, for example, a low-dropout (LDO) regulator that may generate power for powering the processor 1210 from the power provided by the power source 1204. The processor power 1218 may further be coupled to the processor 1210 and may provide power to the processor 1210.

The system 1200 may further comprise a power supply 1220. The power supply 1220 may be coupled to the power protection 1216 and may receive power from the power source 1204. In some embodiments, the power supply 1220 may comprise a converter that converts the power from the power source 1204 to power for the illumination device 1212. For example, the power supply 1220 may comprise a direct current (DC)-to-DC converter that converts the power from the power supply 1220 from a first voltage to a second voltage for the lighting system 1214 of the illumination device 1212.

Figure 13:
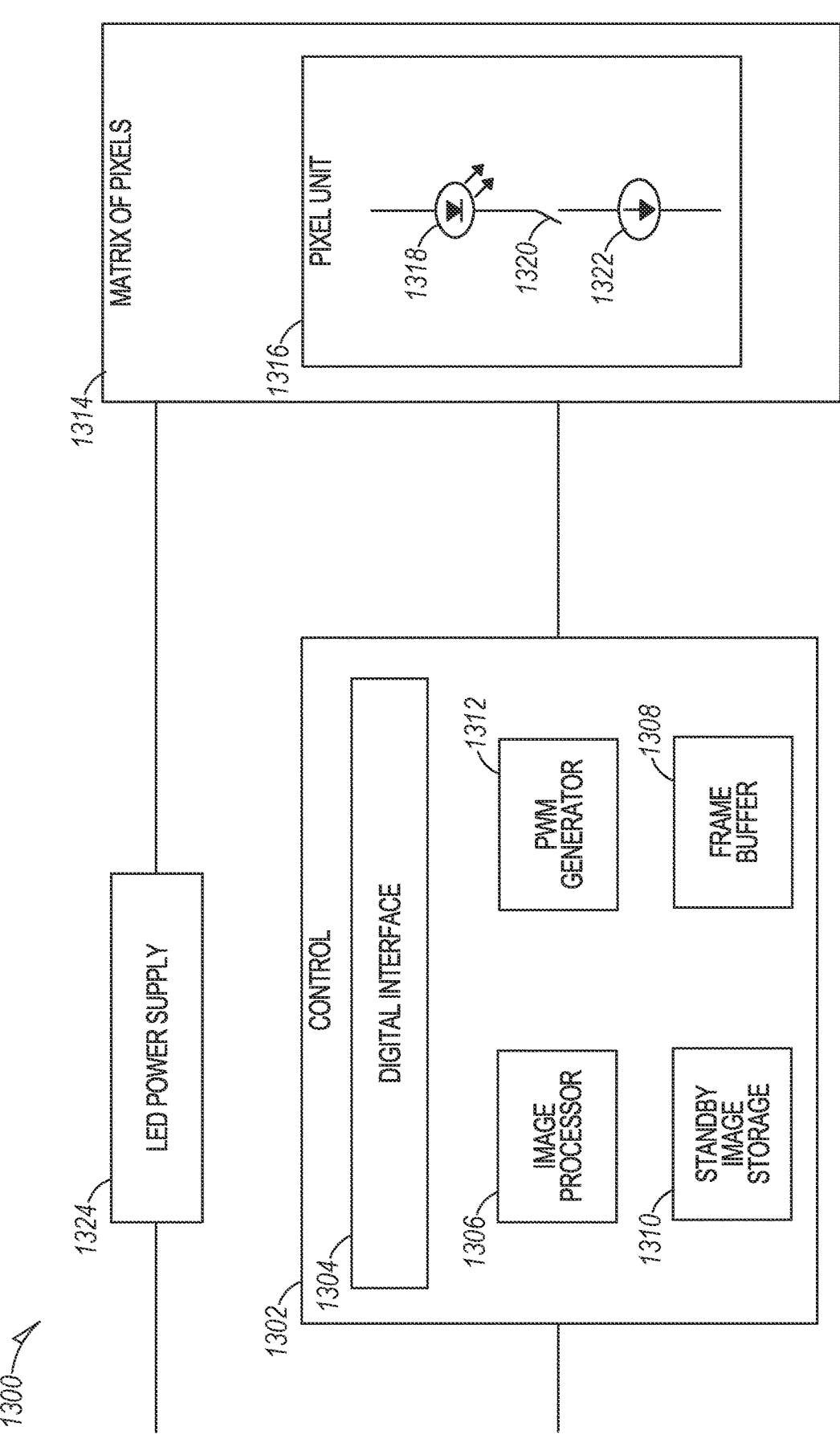
FIG. 13 illustrates an example lighting system 1300, according to some embodiments.

FIG. 13 illustrates an example lighting system 1300, according to some embodiments. As above, some of the elements shown in the lighting system 1300 may not be present, while other additional elements may be disposed in the lighting system 1300. The system 1200 shown in FIG. 12 may include one or more of the features of the lighting system 1300. The lighting system 1300 may include a control module 1302. In some embodiments, some or all of the components described as the control module 1302 may be disposed on a compound metal oxide semiconductor (CMOS) backplane. The control module 1302 may be coupled to or include the processor 1210 of the overall system 1200 shown in FIG. 12. The control module 1302 may receive image data and inquiries from the processor 1210. The control module 1302 may further provide feedback to the processor 1210.

The control module 1302 may include a digital interface 1304. The digital interface 1304 may facilitate communication with the processor and other components within the lighting system 1300. For example, the digital interface 1304 may comprise an SPI interface in some embodiments, where the SPI interface may facilitate communication.

The control module 1302 may further include an image processor 1306. The image processor 1306 may be a dedicated processor that is different from, or may be the same as, the processor 1210 shown in FIG. 12. The image processor 1306 may receive the image data via the digital interface 1304 and may process the image data to produce indications of PWM duty cycles and/or intensities of light for causing the lighting system 1300 to produce the images indicated by the image data.

The control module 1302 may further include a frame buffer 1308 and a standby image storage 1310. The frame buffer 1308 may receive the indications produced by the image processor 1306 and store the indications for implementation. The standby image storage 1310 may further store indications of PWM duty cycles, intensities of light, and/or turn-on times. The indications stored in the standby image storage 1310 may be implemented in the absence of indications stored in the frame buffer 1308. For example, the frame buffer 1308 may retrieve the indications from the standby image storage 1310 when the frame buffer 1308 is empty.

The control module 1302 may further include a PWM generator 1312. The PWM generator 1312 may receive the indications from the frame buffer 1308 and may produce PWM signals in accordance with the indications. The PWM generator 1312 may further determine intensities of light based on the indications and produce a signal to cause the intensities of light to be produced.

The lighting system 1300 may include a micro-LED array 1314. The micro-LED array 1314 may include a plurality of pixels, where each of the pixels includes a pixel unit 1316 that may be controlled individually or in groups of pixel units 1316. In particular, the pixel unit 1316 may include an LED 1318, a PWM switch 1320, and a current source 1322. The pixel unit 1316 may receive the signals from the PWM generator 1312. The PWM signal from the PWM generator 1312 may cause the PWM switch 1320 to open and close in accordance with the value of the PWM signal. The signal corresponding to the intensities of light may cause the current source 1322 produce a current flow to cause the LED 1318 to produce the corresponding intensities of light.

The lighting system 1300 may further include an LED power supply 1324, which also may include an optical step up transformer such as that described herein. In some embodiments, the LED power supply 1324 may be coupled to the power supply 1220 and may receive power from the power supply 1220. The LED power supply 1324 may produce power for the LEDs of the micro-LED array 1314. The LED power supply 1324 may be coupled to the micro-LED array 1314 and may provide the power for the LEDs to the micro-LED array 1314.

Figure 14:
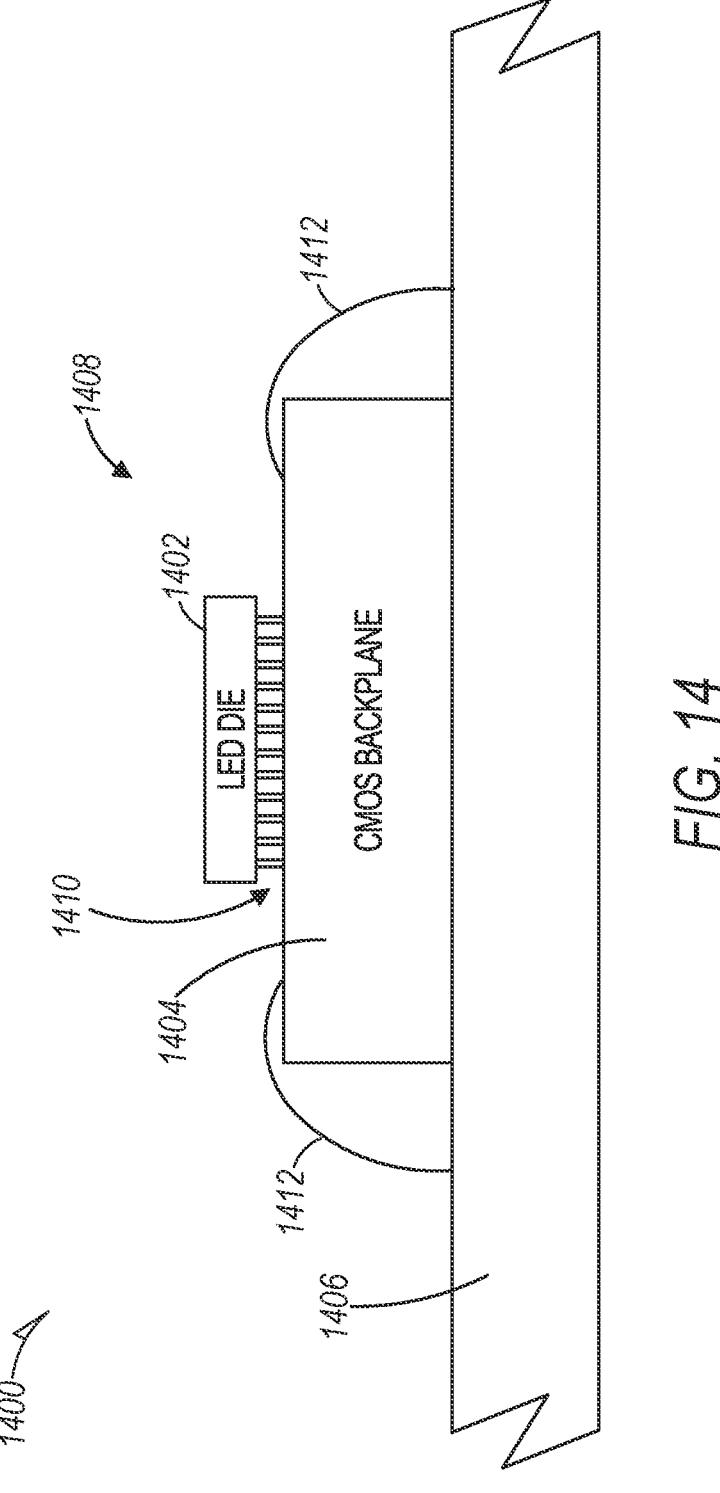
FIG. 14 illustrates an example hardware arrangement 1400 for implementing the above, according to some embodiments.

FIG. 14 illustrates an example hardware arrangement 1400 for implementing the above, according to some embodiments. In particular, the hardware arrangement 1400 may illustrate hardware components that may implement the system 1200. The hardware arrangement 1400 may include an integrated LED 1408. The integrated LED 1408 may include an LED die 1402 and a CMOS backplane 1404. The LED die 1402 may be coupled to the CMOS backplane 1404 by one or more interconnects 1410, where the interconnects 1410 may provide for transmission of signals between the LED die 1402 and the CMOS backplane 1404. The interconnects 1410 may comprise one or more solder bump joints, one or more copper pillar bump joints, or some combination thereof.

The LED die 1402 may include circuitry to implement the micro-LED array. In particular, the LED die 1402 may include a plurality of micro-LEDs. The LED die 1402 may include a shared active layer and a shared substrate for the micro-LED array, and thereby the micro-LED array may be a monolithic micro-LED array. Each micro-LED of the micro-LED array may include an individual segmented active layer and/or substrate. In some embodiments, the LED die 1402 may further include switches and current sources to drive the micro-LED array. In other embodiments, the PWM switches and the current sources may be included in the CMOS backplane 1404.

The CMOS backplane 1404 may include circuitry to implement the control module and/or the LED power supply. The CMOS backplane 1404 may utilize the interconnects 1410 to provide the micro-LED array with the PWM signals and the signals for the intensity for causing the micro-LED array to produce light in accordance with the PWM signals and the intensity. Because of the relatively large number and density of connections to drive the micro-LED array compared to standard LED arrays, different embodiments may be used to electrically connect the CMOS backplane 1404 and the LED die 1402. Either the bonding pad pitch of the CMOS backplane 1404 may be the same as the pitch of bonding pads in the micro-LED array, or the bonding pad pitch of the CMOS backplane 1404 may be larger than the pitch of bonding pads in the micro-LED array.

The hardware arrangement 1400 may further include a PCB 1406. The PCB 1406 may include circuitry to implement functionality such as that shown in FIG. 12 (the power protection 1216, the processor power 1218, the sensor module 1206, the transceiver 1208, the processor 1210, or portions thereof). The PCB 1406 may be coupled to the CMOS backplane 1404. For example, the PCB 1406 may be coupled to the CMOS backplane 1404 via one or more wirebonds 1412. The PCB 1406 and the CMOS backplane 1404 may exchange image data, power, and/or feedback via the coupling, among other signals.

As shown, the micro-LEDs and circuitry supporting the micro-LED array can be packaged and include a submount or printed circuit board for powering and controlling light production by the micro-LEDs. The PCCB supporting the micro-LED array may include electrical vias, heat sinks, ground planes, electrical traces, and flip chip or other mounting systems. The submount or PCB may be formed of any suitable material, such as ceramic, silicon, aluminum, etc. If the submount material is conductive, an insulating layer may be formed over the substrate material, and a metal electrode pattern formed over the insulating layer for contact with the micro-LED array. The submount can act as a mechanical support, providing an electrical interface between electrodes on the micro-LED array and a power supply, and also provide heat sink functionality.

A variety of applications may be supported by micro-LED arrays. Such applications may include a stand-alone applications to provide general illumination (e.g., within a room or vehicle) or to provide specific images. In addition to devices such as a luminaire, projector, mobile device, the system may be used to provide either augmented reality (AR) and virtual reality (VR)-based applications. Various types of devices may be used to provide AR/VR to users, including headsets, glasses, and projectors. Such an AR/VR system may include components similar to those described above: the micro-LED array, a display or screen (which may include touchscreen elements), a micro-LED array controller, sensors, and a controller, among others. The AR/VR components can be disposed in a single structure, or one or more of the components shown can be mounted separately and connected via wired or wireless communication. Power and user data may be provided to the controller. The user data input can include information provided by audio instructions, haptic feedback, eye or pupil positioning, or connected keyboard, mouse, or game controller. The sensors may include cameras, depth sensors, audio sensors, accelerometers, two or three axis gyroscopes and other types of motion and/or environmental/wearer sensors that provide the user input data. Other sensors can include but are not limited to air pressure, stress sensors, temperature sensors, or any other suitable sensors for local or remote environmental monitoring. In some embodiments, the control input can include detected touch or taps, gestural input, or control based on headset or display position. As another example, based on the one or more measurement signals from one or more gyroscope or position sensors that measure translation or rotational movement, an estimated position of the AR/VR system relative to an initial position can be determined.

In some embodiments, the controller may control individual micro-LEDs or one or more micro-LED pixels (groups of micro-LEDs) to display content (AR/VR and/or non-AR/VR) to the user while controlling other micro-LEDs and sensors used in eye tracking to adjust the content displayed. Content display micro-LEDs may be designed to emit light within the visible band (approximately 400 nm to 780 nm) while micro-LEDs used for tracking may be designed to emit light in the IR band (approximately 780 nm to 2,200 nm). In some embodiments, the tracking micro-LEDs and content micro-LEDs may be simultaneously active. In some embodiments, the tracking micro-LEDs may be controlled to emit tracking light during a time period that content micro-LEDs are deactivated and are thus not displaying content to the user. The AR/VR system can incorporate optics, such as those described above, and/or an AR/VR display, for example to couple light emitted by micro-LED array onto the AR/VR display.

In some embodiments, the AR/VR controller may use data from the sensors to integrate measurement signals received from the accelerometers over time to estimate a velocity vector and integrate the velocity vector over time to determine an estimated position of a reference point for the AR/VR system. In other embodiments, the reference point used to describe the position of the AR/VR system can be based on depth sensor, camera positioning views, or optical field flow. Based on changes in position, orientation, or movement of the AR/VR system, the system controller can send images or instructions the light emitting array controller. Changes or modification the images or instructions can also be made by user data input, or automated data input.

In the detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function.

The description uses the phrases "in an embodiment" or "in embodiments," which may each refer to one or more of the same or different embodiments. Furthermore, the terms "comprising," "including," "having," and the like, as used with respect to embodiments, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

In some examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the accompanying drawings may be combined in various possible configurations, all of which are clearly within the broad scope. In certain cases, it may be easier to describe one or more of the functionalities of a given set of flows by only referencing a limited number of electrical elements.

As used herein, the states of switches may be referred to as "open" and "closed." In some embodiments, a switch may comprise a physical throw, where the term "open" may refer to the throw opening the circuit in which the switch is implemented preventing the flow of current and the term "closed" may refer to the throw completing the circuit in which the switch is implemented allowing the flow of current. In some embodiments, a switch may comprise a transistor, where the term "open" may refer to the transistor presenting a high resistance that allows a minimal amount of current to flow and the term "closed" may refer to the transistor presenting that allows a large amount of current to flow. Further, when referring to a switch comprising a transistor allowing current flow or preventing current flow, it should be understood that current flow when the switch is allowing current flow may be an amount of current flow through the transistor when "closed" and the current flow when the switch is preventing current flow may be an amount of current flow through the transistor when "open" (which may be non-zero in some instances). It should be understood that the amount of current allowed to the flow through the transistor when "open" and when "closed" can be dependent on the characteristics of the transistor, and the terms "open" and "closed" are to be interpreted as one having ordinary skill in the art would understand when referring to a transistor being utilized as a switch.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It should be appreciated that the electrical circuits of the accompanying drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In some embodiments, any number of electrical circuits of the accompanying drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on a particular configuration, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the accompanying drawings may be implemented as stand-alone modules (e.g., a device with associated components and circuitry configured to perform a specific application or function) or implemented as plug-in modules into application specific hardware of electronic devices. Note that some embodiments may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, components and/or procedures described herein may be implemented in one or more silicon cores in Application Specific Integrated Circuits (ASICs), Field Programmable Gate Arrays (FPGAs), and other semiconductor chips.

It is also important to note that the functions related to components and/or procedures described herein and/or the procedure may illustrate some of the possible functions that may be executed by, or within, the systems described herein. Some of these operations may be deleted or removed where appropriate, or these operations may be modified or changed considerably without departing from the scope. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of any of the devices and systems described herein may also be implemented with respect to the methods or processes described herein and specifics in the examples may be used anywhere in one or more embodiments.

The invention claimed is:

1. An optical step-up transformer system comprising:

a light emitter configured to be coupled to a power source configured to provide a voltage having a predetermined amplitude, the light emitter configured to emit light based on the voltage;

a first light detector configured to detect the light from the light emitter and provide a voltage in response, the first light detector including a plurality of individual light detectors coupled in series, an output voltage of the first light detector being about the predetermined amplitude times a number of the individual light detectors;

a secondary light emitter coupled to the first light detector, the secondary light emitter configured to emit light based on the output voltage of the first light detector; and a switch configured to couple the first light detector to a capacitor and the capacitor to the secondary light emitter, the capacitor configured to be charged by the first light detector at a first time and discharged through the secondary light emitter at a second time.

2. The optical step-up transformer system of claim 1, wherein the light emitter is electrically isolated from, and optically coupled to, the first light detector.

3. The optical step-up transformer system of claim 1, wherein the light emitter is a light emitting diode (LED), the individual light detectors are photodiodes, and the secondary light emitter is a camera flash.

4. The optical step-up transformer system of claim 1, wherein the first light detector includes a first set of individual light detectors coupled in series and a second set of individual light detectors coupled in series, the first set of individual light detectors coupled in parallel with the second set of individual light detectors.

5. The optical step-up transformer system of claim 1, wherein the light emitter includes a first set of individual light emitters and a second set of individual light emitters connected in series, the first set of individual light emitters coupled in parallel with the second set of individual light emitters.

6. The optical step-up transformer system of claim 1, further comprising the power source, wherein an anode of the light emitter is coupled to an anode of the first light detector and the power source is configured to provide a positive voltage to the anode of the light emitter and the anode of the first light detector.

7. The optical step-up transformer system of claim 1, further comprising the power source, wherein:
the light emitter and first light detector are formed as a gallium nitride (GaN) monolithic device, and
a cathode of the light emitter is coupled to a cathode of the first light detector and the power source is configured to provide a negative voltage to the cathode of the light emitter and the cathode of the first light detector.

8. The optical step-up transformer system of claim 1, wherein:
the first light detector includes a first set of individual light detectors coupled in series and a second set of individual light detectors coupled in series,
the first set of individual light detectors are coupled in parallel with the second set of individual light detectors such that a terminal anode of the first set of individual light detectors is coupled to a terminal cathode of the second set of individual light detectors and a terminal cathode of the first set of individual light detectors is coupled to a terminal anode of the second set of individual light detectors, and
the optical step-up transformer system further comprises a Cockcroft-Walton multiplier coupled to:
a first junction between the terminal anode of the first set of individual light detectors and the terminal cathode of the second set of individual light detectors, and
a first junction between the terminal cathode of the first set of individual light detectors and the terminal anode of the second set of individual light detectors.

9. The optical step-up transformer system of claim 1, wherein the light emitter and the first light detector are monolithic and share a common cathode or a common anode.

10. The optical step-up transformer system of claim 1, wherein:
the light emitter is circular and formed on a substrate and each of the individual light detectors is substantially semicircular and are formed on the substrate, the individual light detectors surround the light emitter, and
active semiconductor layers of the individual light detectors are coplanar with an active semiconductor layer of the light emitter.

11. The optical step-up transformer system of claim 1, wherein:
the light emitter includes a plurality of rectangular colinear individual light emitters formed on a substrate, and
the individual light detectors are substantially L shaped, substantially surround the light emitter, and are formed on the substrate.

12. The optical step-up transformer system of claim 1, further comprising the power source, wherein the power source is configured to provide a pulse width modulated (PWM) voltage having the predetermined amplitude.

13. An optical step-up transformer comprising:
a circular light emitter configured to emit light and comprising a radial notch from an edge in the light emitter to a center of the light emitter that is configured to suppress a whispering gallery mode in the optical step-up transformer; and
an annular light detector configured to detect the light from the light emitter and provide a current in response, the light emitter and the light detector being monolithic and sharing a common cathode or anode, the light detector continuously surrounding the light emitter.

14. The optical step-up transformer of claim 13, wherein the radial notch is a wedge and the light emitter is pie-shaped.

15. The optical step-up transformer of claim 13, wherein the radial notch is semi-circular in shape.

16. An optical step-up transformer system comprising:
a light emitter configured to be coupled to a power source configured to provide a voltage having a predetermined amplitude, the light emitter configured to emit light based on the voltage; and
a first light detector configured to detect the light from the light emitter and provide a voltage in response, the first light detector including a plurality of individual light detectors coupled in series, an output voltage of the first light detector being about the predetermined amplitude times a number of the individual light detectors, wherein:
the first light detector includes a first set of individual light detectors coupled in series and a second set of individual light detectors coupled in series,
the first set of individual light detectors are coupled in parallel with the second set of individual light detectors such that a terminal anode of the first set of individual light detectors is coupled to a terminal cathode of the second set of individual light detectors and a terminal cathode of the first set of individual light detectors is coupled to a terminal anode of the second set of individual light detectors, and
the optical step-up transformer system further comprises a Cockcroft-Walton multiplier coupled to:
a first junction between the terminal anode of the first set of individual light detectors and the terminal cathode of the second set of individual light detectors, and
a first junction between the terminal cathode of the first set of individual light detectors and the terminal anode of the second set of individual light detectors.

17. The optical step-up transformer system of claim 16, further comprising a second light emitter coupled to the first light detector, the second light emitter configured to emit light based on the output voltage of the first light detector.

18. The optical step-up transformer system of claim 16, wherein the first set of individual light detectors are coupled in parallel with the second set of individual light detectors.

19. The optical step-up transformer system of claim 16, wherein:

the light emitter is circular and formed on a substrate and each of the individual light detectors is semicircular and are formed on the substrate, the individual light detectors surround the light emitter, and active semiconductor layers of the individual light detectors are coplanar with an active semiconductor layer of the light emitter.

20. The optical step-up transformer system of claim 16, wherein:

the light emitter includes a plurality of rectangular colinear individual light emitters formed on a substrate, and the individual light detectors are substantially L shaped, substantially surround the light emitter, and are formed on the substrate.

\* \* \* \* \*